United States Patent
Yin et al.

(10) Patent No.: US 8,383,472 B2
(45) Date of Patent: Feb. 26, 2013

(54) INVERTER, METHOD OF MANUFACTURING THE SAME, AND LOGIC CIRCUIT INCLUDING THE INVERTER

(75) Inventors: Huaxiang Yin, Yongin-si (KR); I-hun Song, Seongnam-si (KR); Chang-jung Kim, Yongin-si (KR); Sang-wook Kim, Yongin-si (KR); Sun-il Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/067,306

(22) Filed: May 24, 2011

(65) Prior Publication Data

US 2011/0230021 A1 Sep. 22, 2011

Related U.S. Application Data

(62) Division of application No. 12/591,654, filed on Nov. 25, 2009, now Pat. No. 7,977,978.

(30) Foreign Application Priority Data

Apr. 17, 2009 (KR) .......................... 10-2009-0033845

(51) Int. Cl.
  *H01L 21/336* (2006.01)
(52) U.S. Cl. ......... 438/197; 257/E21.409; 257/E21.414; 326/103
(58) Field of Classification Search .................. 438/265, 438/197; 326/103; 257/E21.409, E21.414
See application file for complete search history.

(56) References Cited

U.S. PATENT DOCUMENTS

| 4,942,441 | A | 7/1990 | Konishi et al. |
| 4,994,866 | A | 2/1991 | Awano |
| 5,721,516 | A | 2/1998 | Furuchi |
| 6,586,970 | B1 | 7/2003 | Jung |
| 2008/0191204 | A1* | 8/2008 | Kim et al. ........................ 257/43 |
| 2010/0085081 | A1* | 4/2010 | Ofuji et al. ..................... 326/102 |

FOREIGN PATENT DOCUMENTS

| JP | 11-135647 | | 5/1999 |
| JP | 2006-237624 | | 9/2006 |
| JP | 2009004733 | A * | 1/2009 |
| KR | 10-1997-0019085 | | 4/1997 |
| KR | 10-1999-0065451 | | 8/1999 |
| KR | 10-2001-0048333 | | 6/2001 |

OTHER PUBLICATIONS

U.S. Office Action dated Nov. 12, 2010.
U.S. Notice of Allowance dated Apr. 27, 2011.

* cited by examiner

*Primary Examiner* — Ha Tran T Nguyen
*Assistant Examiner* — Shaun Campbell
(74) *Attorney, Agent, or Firm* — Harness, Dickey & Pierce, P.L.C.

(57) ABSTRACT

Provided are an inverter, a method of manufacturing the inverter, and a logic circuit including the inverter. The inverter may include a first transistor and a second transistor having different channel layer structures. A channel layer of the first transistor may include a lower layer and an upper layer, and a channel layer of the second transistor may be the same as one of the lower layer and the upper layer. At least one of the lower layer and the upper layer may be an oxide layer. The inverter may be an enhancement/depletion (E/D) mode inverter or a complementary inverter.

18 Claims, 19 Drawing Sheets

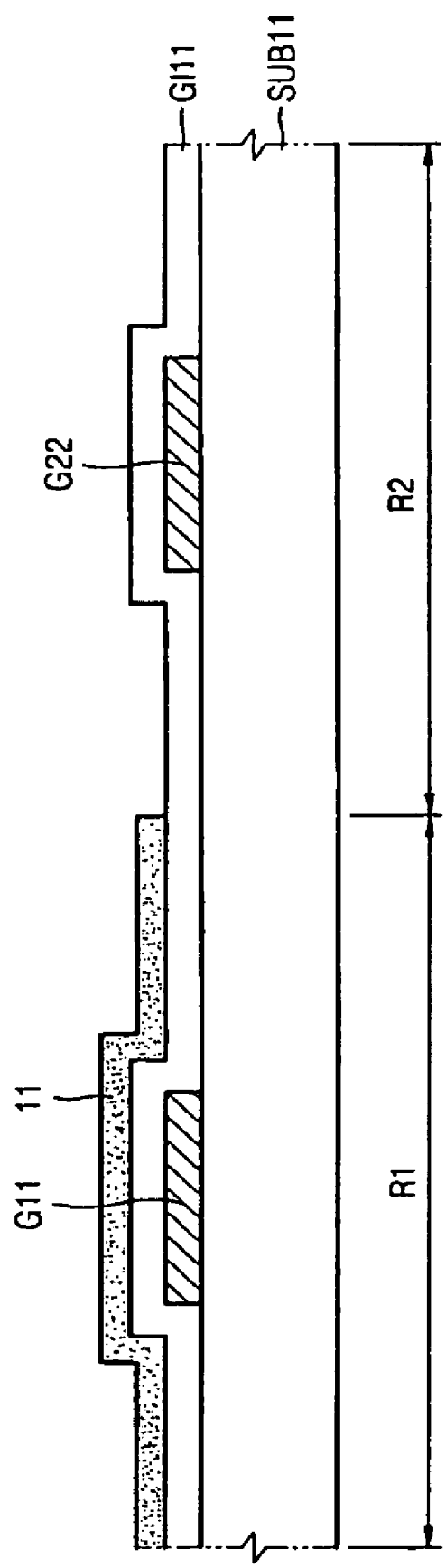

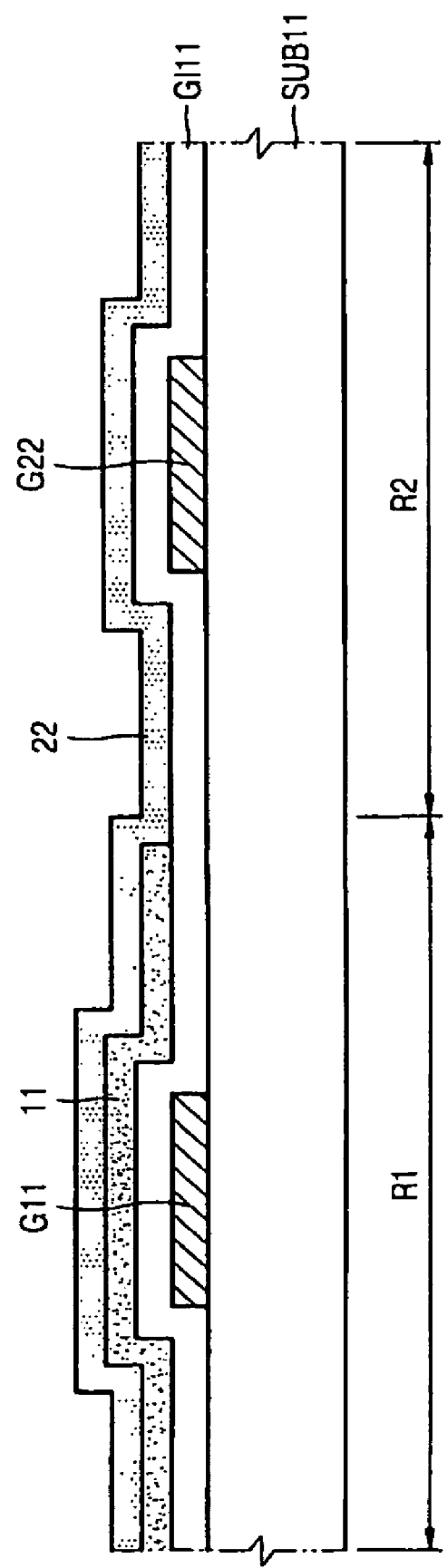

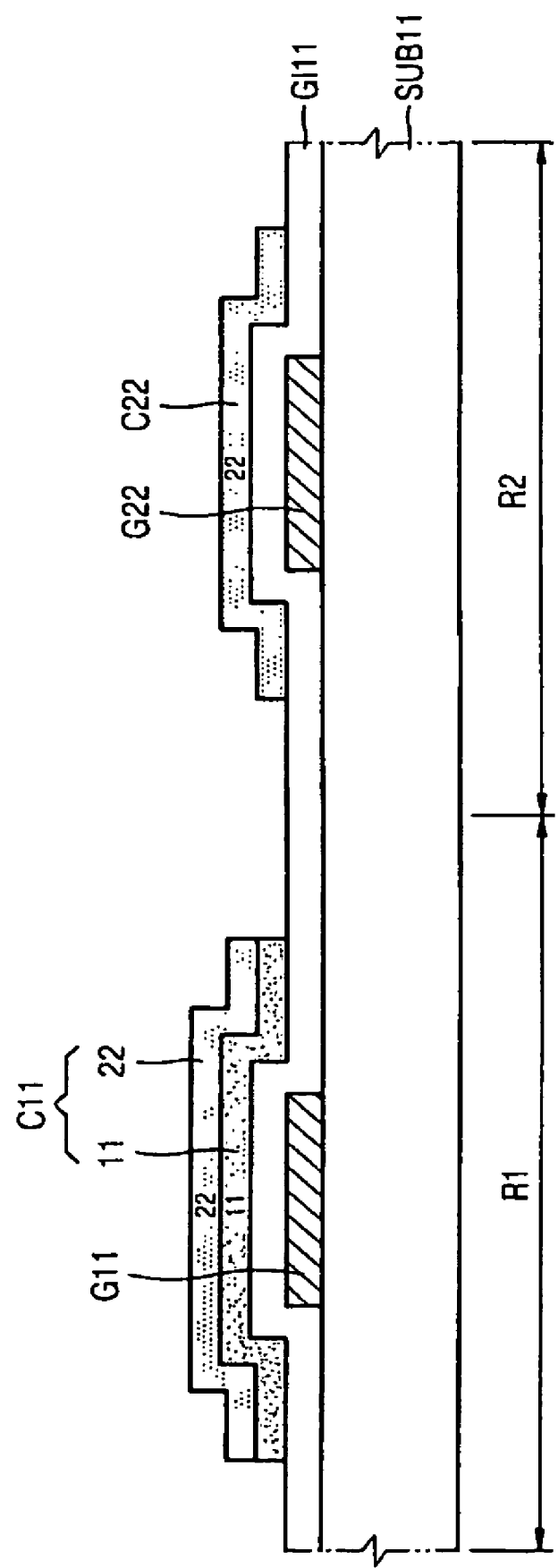

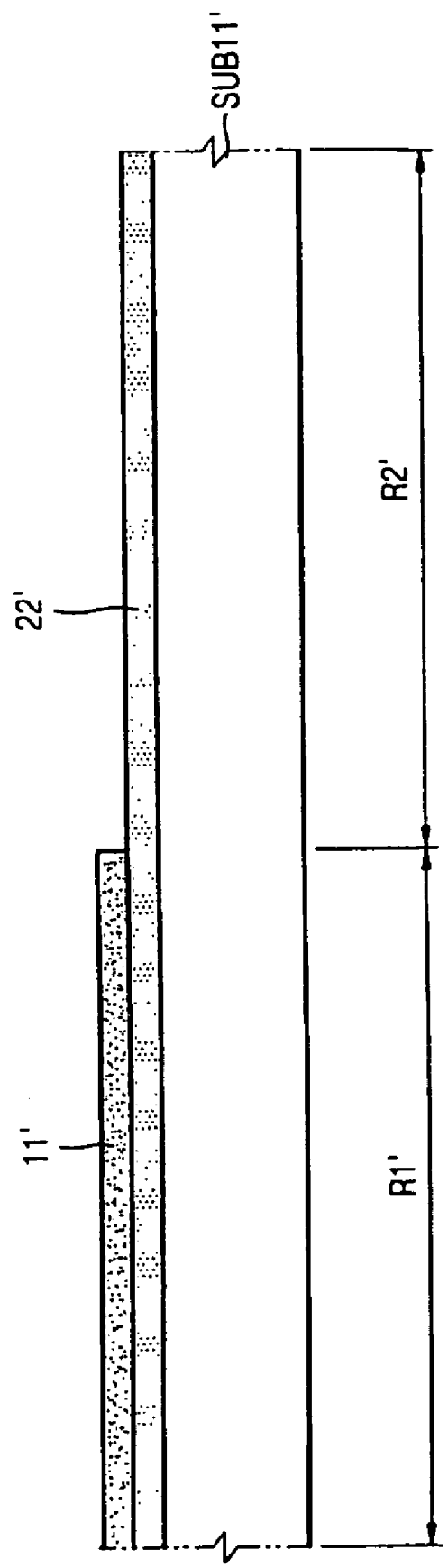

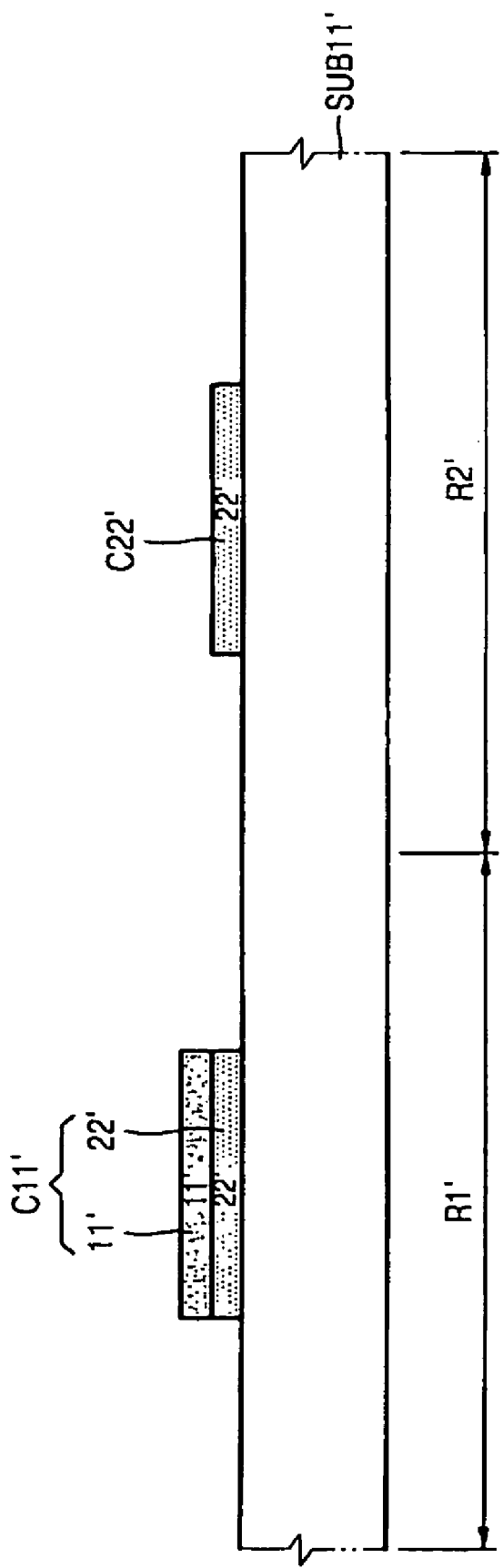

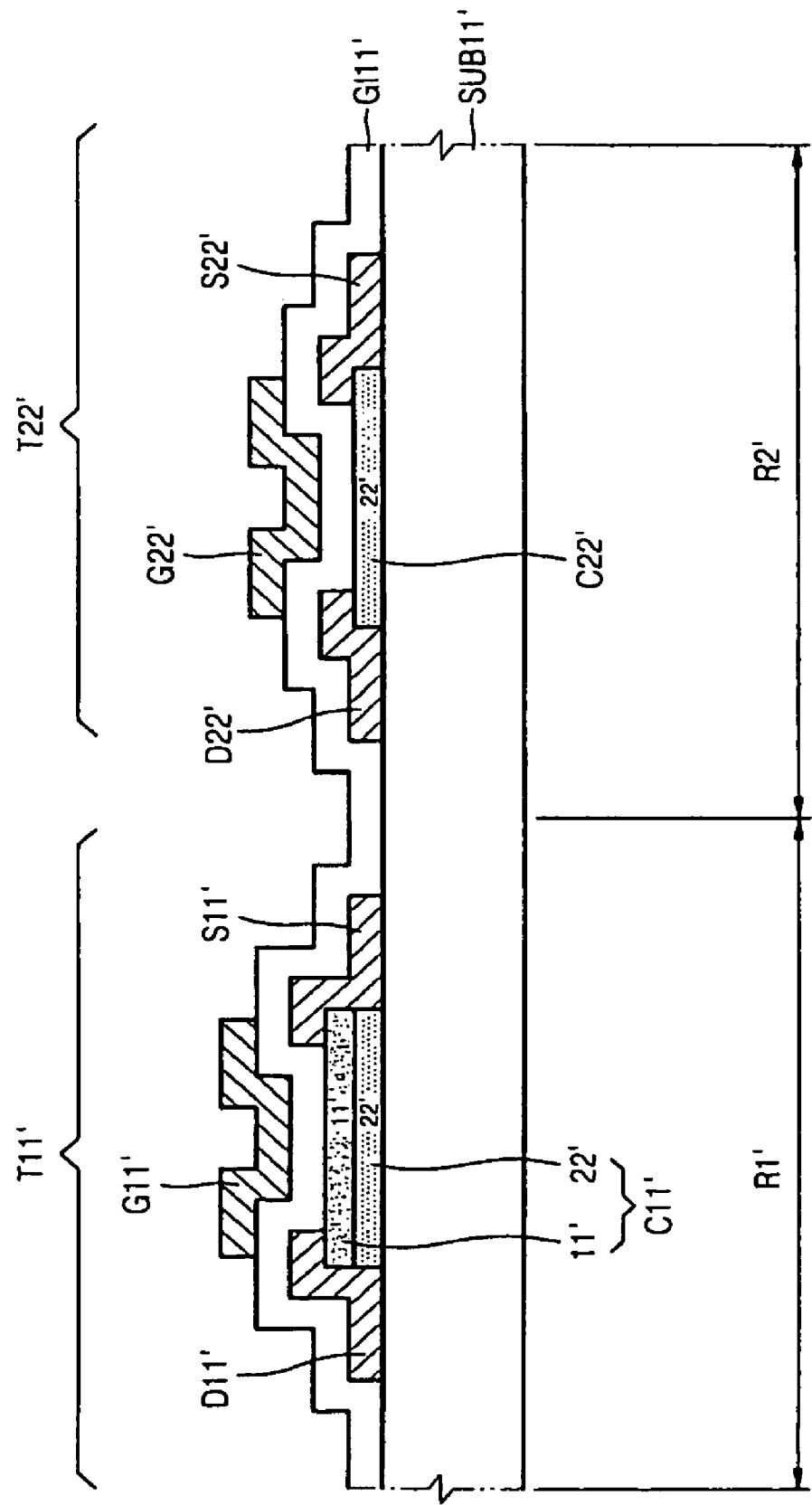

INVERTER, METHOD OF MANUFACTURING THE SAME, AND LOGIC CIRCUIT INCLUDING THE INVERTER

CROSS-REFERENCE TO RELATED APPLICATION

This application is a divisional of and claims priority under 35 U.S.C. §§120, 121 to application Ser. No. 12/591,654, filed on Nov. 25, 2009 now U.S. Pat. No. 7,977,978, which claims priority under 35 U.S.C. §119 to Korean Patent Application No. 10-2009-0033845, filed on Apr. 17, 2009, the contents of each of which are herein incorporated by reference in their entirety for all purposes.

BACKGROUND

1. Field

Example embodiments relate to an inverter, a method of manufacturing the same, and a logic circuit including the inverter.

2. Description of the Related Art

Various logic circuits such as NAND (not and) and NOR (not or) gates are used in semiconductor integrated circuits such as dynamic random access memories (DRAMs), static random access memories (SRAMs), non-volatile memories, liquid crystal display (LCD) devices, organic light emitting devices, and so forth. An inverter is a basic component of such logic circuits.

In general, a Si-based inverter is a complementary metal-oxide semiconductor (CMOS) inverter including both an n-channel metal-oxide semiconductor (NMOS) transistor and a p-channel metal-oxide semiconductor (PMOS) transistor. When a Si layer is used as a channel layer, the NMOS or PMOS transistor may be formed by varying the type of doping elements used for the channel layer and, thus, a CMOS inverter may be manufactured. For example, a p-channel layer is formed by doping a Si layer with a Group 3 element such as boron (B).

However, when the channel layer is formed using an oxide semiconductor, it is difficult to manufacture an inverter having excellent characteristics, due to a difficulty in controlling properties of the oxide semiconductor.

SUMMARY

Example embodiments include an inverter including an oxide semiconductor as a channel material.

Example embodiments include a method of manufacturing the inverter.

Example embodiments include a logic circuit including the inverter.

Additional aspects will be set forth in part in the description which follows and, in part, will be apparent from the description, or may be learned by practice of example embodiments.

According to at least one example embodiment, an inverter includes a first transistor and a second transistor which are connected to each other, wherein a channel layer of the first transistor includes a lower layer and an upper layer, and a channel layer of the second transistor is the same as one of the lower layer and the upper layer.

When the first transistor and the second transistor have a bottom gate structure, the channel layer of the second transistor may be the same as the upper layer.

When the first transistor and the second transistor have a top gate structure, the channel layer of the second transistor may be the same as the lower layer.

The lower layer and the upper layer may be one of a single-layer and a double-layer.

At least one of the lower layer and the upper layer may include an oxide layer.

According to at least one example embodiment, at least one of the first transistor and the second transistor may be an n-channel transistor.

The first transistor may be a depletion mode pull-up transistor and the second transistor may be an enhancement mode pull-down transistor.

One of the lower layer and the upper layer, which is closer to a gate of the first transistor, may have a higher carrier concentration than the other one of the lower layer and the upper layer.

According to the embodiment, the one of the lower layer and the upper layer, which is closer to the gate of the first transistor, may include at least one selected from a first group consisting of an indium zinc oxide (IZO) layer, an indium tin oxide (ITO) layer, an aluminum zinc oxide (AZO) layer, a gallium zinc oxide (GZO) layer, an indium oxide (InO) layer, a GaInZnO layer, a HfInZnO layer, and a Ar-plasma treated GaInZnO layer, or may include at least one selected from a second group consisting of an IZO/GaInZnO layer, an IZO/HfInZnO layer, an ITO/GaInZnO layer, an ITO/HfInZnO layer, an AZO/GaInZnO layer, an AZO/HfInZnO layer, a GZO/GaInZnO layer, a GZO/HfInZnO layer, an InO/GaInZnO layer, an InO/HfInZnO layer and reverse structures of the layers in the second group.

According to the embodiment, the one of the lower layer and the upper layer which is farther from the gate of the first transistor may include at least one selected from a first group consisting of a GaInZnO layer, a HfInZnO layer, and a plasma containing nitrogen treated GaInZnO layer, or may include at least one selected from a second group consisting of an IZO/GaInZnO layer, an IZO/HfInZnO layer, an ITO/GaInZnO layer, an ITO/HfInZnO layer, an AZO/GaInZnO layer, an AZO/HfInZnO layer, a GZO/GaInZnO layer, a GZO/HfInZnO layer, an InO/GaInZnO layer, an InO/HfInZnO layer and reverse structures of the layers in the second group.

According to another example embodiment, the first transistor may include an n-channel transistor, and the second transistor may include a p-channel transistor.

One of the lower layer and the upper layer, which is closer to the gate of the first transistor, may be an n-type layer, and the other of the lower layer and the upper layer, which is farther from the gate of the first transistor, may include a p-type layer.

The first transistor may be a pull-down transistor having a threshold voltage greater than 0V, and the second transistor may be a pull-up transistor having a threshold voltage less than 0V.

One of the lower layer and the upper layer, which is closer to the gate of the first transistor, may include at least one selected from a first group consisting of a GaInZnO layer, a HfInZnO layer, and a plasma containing nitrogen treated GaInZnO layer, or may include at least one selected from a second group consisting of an IZO/GaInZnO layer, an IZO/HfInZnO layer, an ITO/GaInZnO layer, an ITO/HfInZnO layer, an AZO/GaInZnO layer, an AZO/HfInZnO layer, a GZO/GaInZnO layer, a GZO/HfInZnO layer, an InO/GaInZnO layer, an InO/HfInZnO layer and reverse structures of the layers of the second group.

The other one of the upper layer and lower layer, which is farther from the gate of the first transistor, may include at least one selected from a group consisting of a SnO layer, a SnO2 layer, a metal doped SnO2 layer, an X-doped ZnO layer (X indicates at least one element of Groups 1, 2, and 15), an NiO layer, a CuMO2 layer (M is metal of Group 13), a metal doped Cu2O layer, a SrCu2O2 layer, a LaCuOS(Se) layer, and an AgMO2 layer (M is metal of Group 13).

According to at least one other example embodiment, a method of manufacturing an inverter includes the operations of forming a first gate and a second gate respectively on a first region and a second region of a substrate, forming a gate insulating layer to cover the first gate and the second gate, forming a first channel material layer on the gate insulating layer of the first region, forming a second channel material layer on the first channel material layer of the first region and the gate insulating layer of the second region, forming a first channel layer having a structure in which the first channel material layer and the second channel material layer are stacked on the first region, and a second channel layer including the second channel material layer on the second region, by patterning the second channel material layer and the first channel material layer, and forming a first source electrode and a first drain electrode respectively contacting ends of the first channel layer, and forming a second source electrode and a second drain electrode respectively contacting ends of the second channel layer.

The first channel material layer and the second channel material layer may include a single-layer structure or a double-layer structure.

At least one of the first channel material layer and the second channel material layer may include an oxide layer.

The first channel material layer and the second channel material layer may be an n-type layer.

The first channel material layer may include a carrier concentration higher than a carrier concentration of the second channel material layer.

A first transistor formed of the first gate, the gate insulating layer of the first region, the first channel layer, the first source electrode, and the first drain electrode may be a depletion mode pull-up transistor, and a second transistor formed of the second gate, the gate insulating layer of the second region, the second channel layer, the second source electrode, and the second drain electrode may be an enhancement mode pull-down transistor.

The first channel material layer may be an n-type layer, and the second channel material layer may be a p-type layer.

The first transistor formed of the first, the gate insulating layer gate of the first region, the first channel layer, the first source electrode, and the first drain electrode may be a pull-down transistor having a threshold voltage greater than 0V, and the second transistor formed of the second gate, the gate insulating layer of the second region, the second channel layer, the second source electrode, and the second drain electrode may be a pull-up transistor having a threshold voltage less than 0V.

According to at least one example embodiment, a method of manufacturing an inverter includes the operations of forming a first channel material layer on a first region and a second region of a substrate, forming a second channel material layer on the first channel material layer of the first region, forming a first channel layer having a structure in which the first channel material layer and the second channel material layer are stacked on the first region, and a second channel layer including the second channel material layer of the second region, by patterning the second channel material layer and the first channel material layer, forming a first source electrode and a first drain electrode respectively contacting ends of the first channel layer, and forming a second source electrode and a second drain electrode respectively contacting ends of the second channel layer, forming a gate insulating layer to cover the first channel layer, the second channel layer, the first source electrode, the second source electrode, the first drain electrode, and the second drain electrode, and forming a first gate on the gate insulating layer of the first region, and forming a second gate on the gate insulating layer of the second region.

The first channel material layer and the second channel material layer may include a single-layer structure or a double-layer structure.

At least one of the first channel material layer and the second channel material layer may include an oxide layer.

The first channel material layer and the second channel material layer may be an n-type layer.

The second channel material layer may have a carrier concentration higher than a carrier concentration of the first channel material layer.

A first transistor formed of the first gate, the gate insulating layer of the first region, the first channel layer, the first source electrode, and the first drain electrode may be a depletion mode pull-up transistor, and a second transistor formed of the second gate, the gate insulating layer of the second region, the second channel layer, the second source electrode, and the second drain electrode may be an enhancement mode pull-down transistor.

The first channel material layer may be an n-type layer, and the second channel material layer may be a p-type layer.

The first transistor formed of the first gate, the gate insulating layer of the first region, the first channel layer, the first source electrode, and the first drain electrode may be a pull-down transistor having a threshold voltage greater than 0V, and the second transistor formed of the second gate, the gate insulating layer of the second region, the second channel layer, the second source electrode, and the second drain electrode may be a pull-up transistor having a threshold voltage less than 0V.

According to at least one example embodiment, a logic circuit includes an inverter.

The logic circuit may include at least one selected from the group consisting of a NAND (not and) gate, a NOR (not or) gate, an encoder, a decoder, a multiplexer (MUX), a demultiplexer (DEMUX), a sense amplifier, and an oscillator.

BRIEF DESCRIPTION OF THE DRAWINGS

These and/or other aspects will become apparent and more readily appreciated from the following description of example embodiments, taken in conjunction with the accompanying drawings of which:

FIGS. 7A through 7D illustrate a method of manufacturing an inverter, according to an example embodiment;

FIGS. 8A through 8C illustrate a method of manufacturing an inverter, according to another example embodiment;

DETAILED DESCRIPTION

Figure 1:
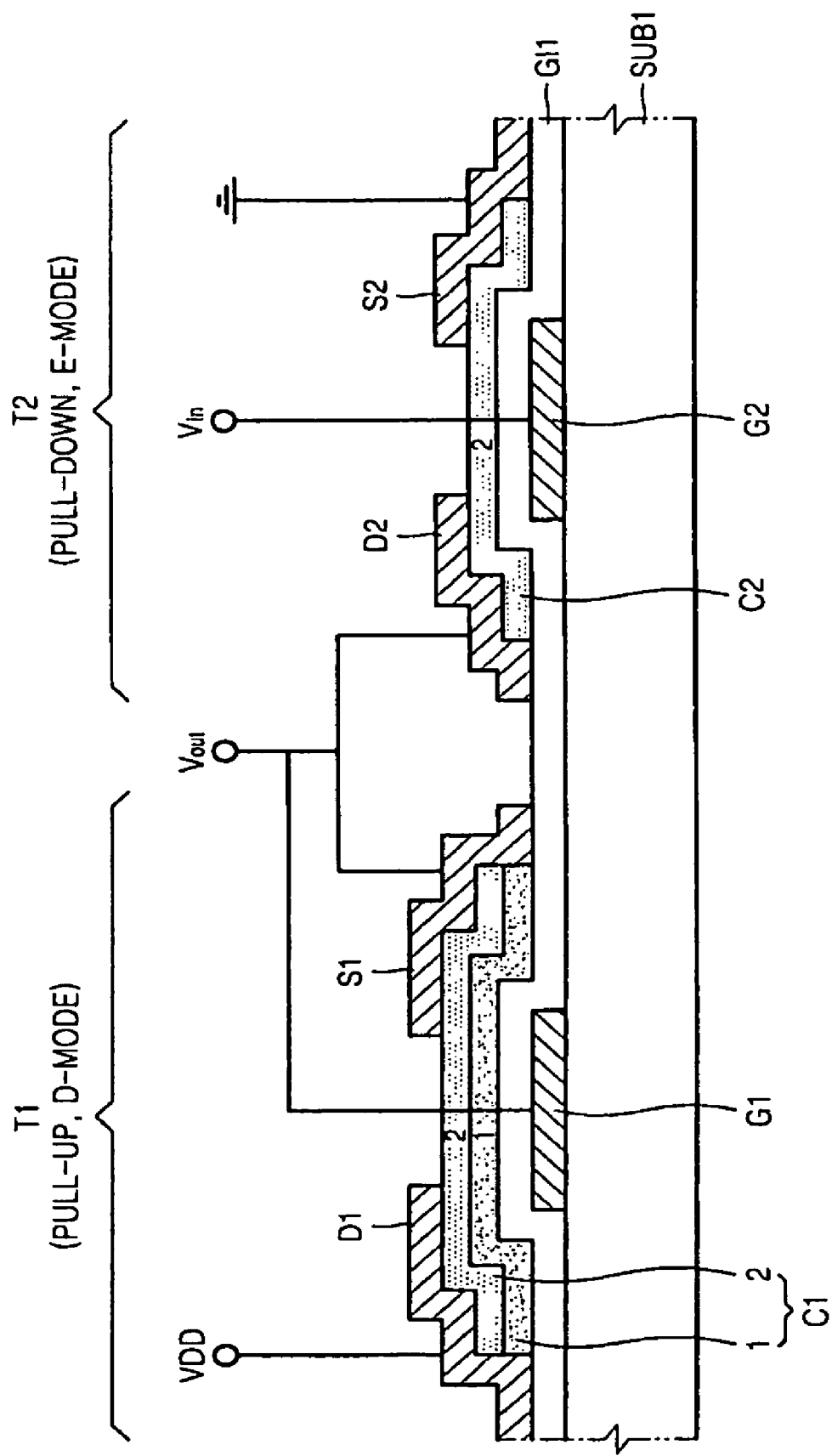
FIGS. 1 and 2 are diagrams of inverters according to an example embodiment.

Various example embodiments will now be described more fully with reference to the accompanying drawings in which some example embodiments are shown.

Detailed illustrative example embodiments are disclosed herein. However, specific structural and functional details disclosed herein are merely representative for purposes of describing example embodiments. Example embodiments may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed on," another element or layer, it may be directly or indirectly formed on the other element or layer. That is, for example, intervening elements or layers may be present. In contrast, when an element or layer is referred to as being "directly formed on" another element, there are no intervening elements or layers present. Other words used to describe the relationship between elements or layers should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions are exaggerated for clarity. Like reference numerals in the drawings denote like elements.

FIG. 1 is a diagram of an inverter according to an example embodiment.

Referring to FIG. 1, the inverter may include a first transistor T1 and a second transistor T2 that are connected to each other on a substrate SUB1. Both the first transistor T1 and the second transistor T2 may be n-channel transistors. In this case, the first transistor T1 may be a depletion mode (D-mode) pull-up transistor and the second transistor T2 may be an enhancement mode (E-mode) pull-down transistor. When a gate voltage is 0V, a depletion mode transistor is in an ON-state in which a substantial current flows. On the other hand, when the gate voltage is 0V, an enhancement mode transistor is in an OFF-state. Thus, a threshold voltage of the depletion mode transistor may be less than 0V, and a threshold voltage of the enhancement mode transistor may be greater than 0V. The first transistor T1 may be called a load transistor, and the second transistor T2 may be called a driving transistor.

A detailed description about structures of the first transistor T1 and the second transistor T2 will now be provided. A first gate G1 and a second gate G2, separated from each other, may be arranged on the substrate SUB1. The substrate SUB1 may be one from among various substrates such as a glass substrate, a silicon substrate, a plastic substrate, and the like, which are used in a semiconductor process. An under insulating layer (not shown) may be arranged on an upper surface of the substrate SUB1. The first gate G1 and the second gate G2 may be arranged on the under insulating layer. A gate insulating layer GI1 may be formed to cover the first gate G1 and the second gate G2. The gate insulating layer GI1 may be a silicon oxide layer, a silicon nitride layer, or another insulating layer formed of a high dielectric material having a dielectric constant greater than that of a silicon nitride. A first channel layer C1 may be arranged on the gate insulating layer GI1 disposed on the first gate G1, and a second channel layer C2 may be arranged on the gate insulating layer GI1 disposed on the second gate G2. The first channel layer C1 and the second channel layer C2 may be oxide layers having different structures. A detailed description of the first channel layer C1 and the second channel layer C2 will be provided later. A first source electrode S1 and a first drain electrode D1 may be arranged to contact ends of the first channel layer C1. A second source electrode S2 and a second drain electrode D2 may be arranged to contact ends of the second channel layer C2. The first source electrode S1 and the second drain electrode D2 may be separated but may be integrally formed. Although not illustrated in FIG. 1, a passivation layer may further be arranged above the gate insulating layer GI1 so as to cover the first channel layer C1, the first source electrode S1, the first drain electrode D1, the second channel layer C2, the second source electrode S2, and the second drain electrode D2. The first transistor T1 may include the first gate G1, the first channel layer C1, the first source electrode S1, and the first drain electrode D1. The second transistor T2 may include the second gate G2, the second channel layer C2, the second source electrode S2, and the second drain electrode D2.

The first drain electrode D1 may be connected to a power source terminal VDD, the second gate G2 may be connected to an input terminal Vin, and the first source electrode S1, the second drain electrode D2, and the first gate G1 may be commonly connected to an output terminal Vout. The second source electrode S2 may be grounded.

Hereinafter, the first channel layer C1 and the second channel layer C2 will be described in detail. The first channel layer C1 may have a structure in which a first layer 1 and a second layer 2 are sequentially stacked. The first layer 1, on the first gate G1, may be used as a main channel. The second channel layer C2 may be the same layer as the second layer 2 of the first channel layer C1. If the first layer 1 and the second layer 2 of the first channel layer C1 are called a lower layer and an upper layer, respectively, the second channel layer C2 may be the same layer as the upper layer. The first layer 1 and the second layer 2 may be oxide semiconductor layers. The first layer 1 may have a carrier concentration higher than that of the second layer 2. Due to the first layer 1 having the high carrier concentration, a threshold voltage of the first transistor T1 may be decreased. Thus, the first transistor T1 may be the depletion mode transistor having a threshold voltage less than 0V. In the case where a thickness of the first layer 1 of the first channel layer C1 is small, the second layer 2 may also have an effect on the threshold voltage of the first transistor T1. The first layer 1 may also function to increase mobility of the first transistor T1. A second layer 2 of the first channel layer C1 and the second channel layer C2 may have relatively low carrier concentration and, thus, the second transistor T2 may be the enhancement mode transistor having the threshold voltage greater than 0V. In the case where a thickness of the second channel layer C2 is small, the second transistor T2 may have a positive (+) threshold voltage because when the thickness of the second channel layer C2 is less than a critical thickness, an amount of electrons in the second channel layer C2 is decreased and it is difficult to form a depletion region. Each of the first layer 1 and the second layer 2 may be a single-layer or a multi-layer such as a double-layer. The first layer 1 and the second layer 2 may individually have a thickness of between about 1 nm and about 50 nm, and thicknesses of the first layer 1 and the second layer 2 may be different from or equivalent to each other. Examples of oxide layers to be used as the first layer 1 and the second layer 2 (and the second channel layer 2) are shown in Table 1.

TABLE 1

| First layer 1: n-type | Second layer 2: n-type |
|---|---|
| IZO(indium zinc oxide) layer | GaInZnO(high O2) layer |
| ITO(indium tin oxide) layer | HfInZnO(high O2) layer |
| AZO(aluminum zinc oxide) layer | IZO/GaInZnO(high O2) layer |
| GZO(gallium zinc oxide) layer | IZO/HfInZnO(high O2) layer |
| InO(indium oxide) layer | ITO/GaInZnO(high O2) layer |
| GaInZnO(low O2) layer | ITO/HfInZnO(high O2) layer |
| HfInZnO(low O2) layer | AZO/GaInZnO(high O2) layer |
| IZO/GaInZnO(low O2) layer | AZO/HfInZnO(high O2) layer |
| IZO/HfInZnO(low O2) layer | GZO/GaInZnO(high O2) layer |
| ITO/GaInZnO(low O2) layer | GZO/HfInZnO(high O2) layer |
| ITO/HfInZnO(low O2) layer | InO/GaInZnO(high O2) layer |
| AZO/GaInZnO(low O2) layer | InO/HfInZnO(high O2) layer |
| AZO/HfInZnO(low O2) layer | Plasma containing nitrogen treated GaInZnO layer |
| GZO/GaInZnO(low O2) layer | Thin GaInZnO layer |
| GZO/HfInZnO(low O2) layer | (thickness between about 1 and about 30 nm) |
| InO/GaInZnO(low O2) layer | |
| InO/HfInZnO(low O2) layer | Thin HfInZnO layer |
| Ar-plasma treated GaInZnO layer | (thickness between about 1 and about 30 nm) |

Referring to Table 1, "low O2", which is indicated after some of the materials to be used as the first layer 1, means that those materials are formed in an atmosphere having low oxygen pressure. The GaInZnO(low O2) layer and the HfInZnO (low O2) layer formed in the atmosphere having low oxygen pressure may have a high carrier concentration. Also, when a GaInZnO layer is Ar-plasma treated, the carrier concentration of the GaInZnO layer may be increased. Here, materials to form the first layer 1 are not limited to the materials shown in Table 1. Thus, as well as the materials of Table 1, any semiconductor material having a high carrier concentration may be used to form the first layer 1. In the case where the first layer 1 has a double-layer structure, e.g., the IZO/GaInZnO (low O2) layer structure, the former IZO layer is the lower layer and the latter GaInZnO(low O2) layer is the upper layer. This is the same in other double-layers.

Meanwhile, referring to Table 1, "high O2", which is indicated after some of the materials to be used as the second layer 2, means that those materials are formed in an atmosphere having high oxygen pressure. The GaInZnO(high O2) layer and the HfInZnO(high O2) layer formed in the atmosphere having high oxygen pressure may have a low carrier concentration. Also, when a GaInZnO layer is treated using plasma containing nitrogen, e.g., N20 plasma, the carrier concentration of the GaInZnO layer may be decreased. Also, a GaInZnO layer and a HfInZnO layer each having a thickness less than about 30 nm may be used to form the second layer 2. As described above, when the GaInZnO layer, the HfInZnO layer, and the like each have a small thickness, a transistor (i.e., the second transistor T2) including a channel layer formed of one of the materials, may have a positive (+) threshold voltage. Here, materials to form the second layer 2 are not limited to the materials shown in Table 1. Thus, as well as the materials of Table 1, any semiconductor material allowing the threshold voltage of the second transistor T2 to have a positive (+) value may be used to form the second layer 2.

In this manner, the threshold voltages and the mobility with respect to the first transistor T1 and the second transistor T2 may be easily controlled by allowing the first channel layer C1 and the second channel layer C2 to have different structures and by appropriately selecting materials forming the first channel layer C1 and the second channel layer C2. Thus, it is possible to embody an enhancement/depletion (E/D) mode inverter having the depletion mode pull-up transistor (the first transistor T1) and the enhancement mode pull-down transistor (the second transistor T2). Such an E/D mode inverter may have an excellent operational characteristic compared to a general inverter having a depletion mode pull-up transistor and a depletion mode pull-down transistor.

Referring to FIG. 1, the inverter includes the first transistor T1 and the second transistor T2 having a bottom gate structure. Alternatively, the first transistor T1 and the second transistor T2 may individually have a top gate structure. This case is illustrated in FIG. 2.

Figure 2:
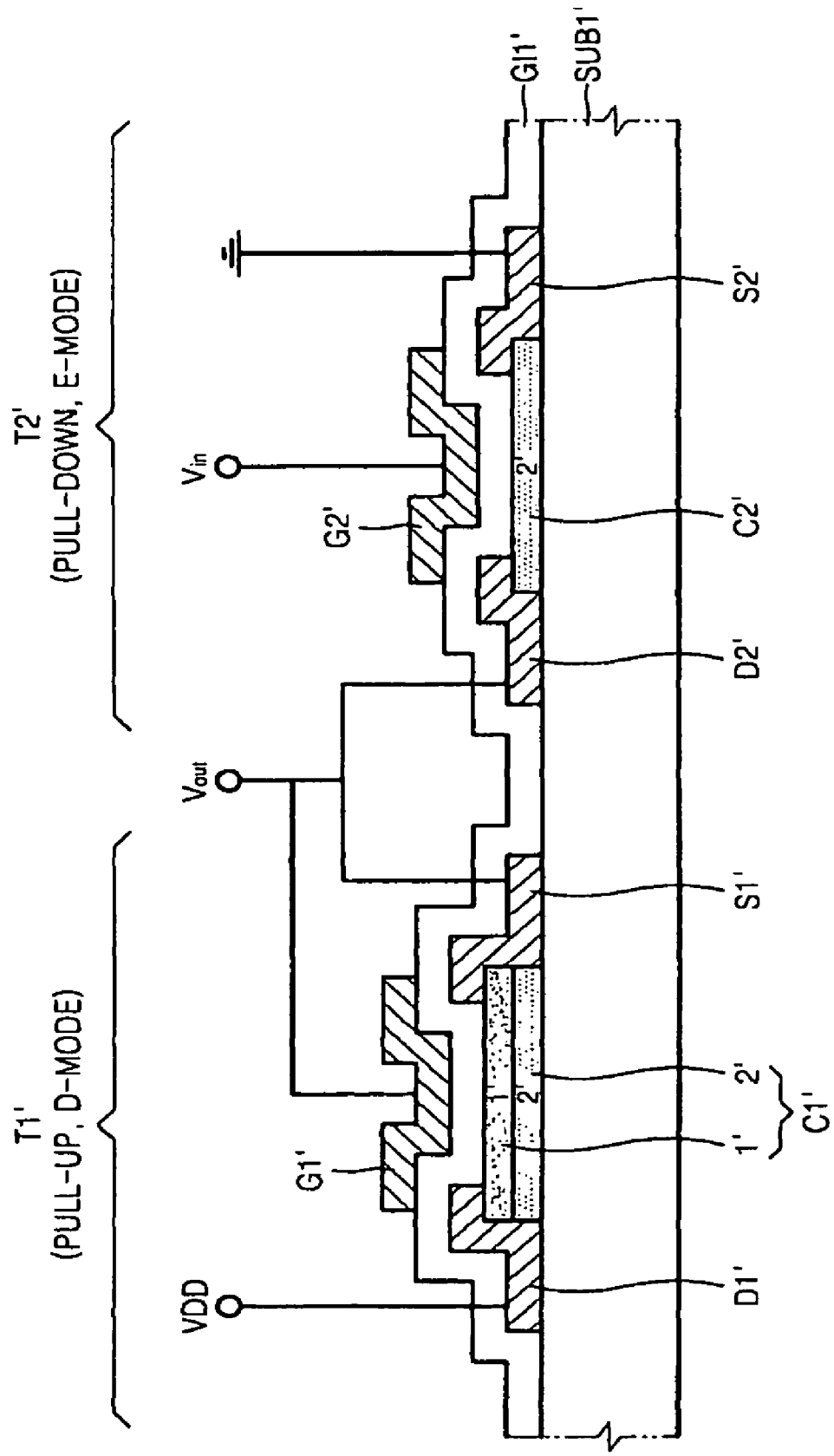

Referring to FIG. 2, a first channel layer C1' and a second channel layer C2' separated from each other may be arranged on a substrate SUB1'. The first channel layer C1' may have a structure in which the positions of the first layer 1 and second layer 2 are switched. That is, the first channel layer C1' of FIG. 2 may have the structure in which a second layer 2' and a first layer 1' are sequentially stacked on the substrate SUB1'. Here, the first layer 1' and the second layer 2' may be the same as the first and second layers 1 and 2 of FIG. 1, respectively. However, the first and second layers 1' and 2' may be multi-layers, such as double-layers. In the case where the first layer 1' and the second layer 2' are the single-layers, the first layer 1' and the second layer 2' may be the same as the first layer 1 and the second layer 2 of FIG. 1, respectively. In the case where the first layer 1' and the second layer 2' are the multi-layers, each of the first layer 1' and the second layer 2' may have a structure in which the first layer 1 and the second layer 2 of FIG. 1 are turned upside down. The second channel layer C2' may be the same layer as the second layer 2'. If the first layer 1' and the second layer 2' of the first channel layer C1' are called an upper layer and a lower layer, respectively, the second channel layer C2' may be the same layer as the lower layer (i.e., the second layer 2').

A first source electrode S1' and a first drain electrode D1' may be arranged on the substrate SUB1' so as to contact ends of the first channel layer C1'. A second source electrode S2' and a second drain electrode D2' may be arranged on the substrate SUB1' so as to contact ends of the second channel layer C2'. A gate insulating layer GI1' may be arranged to cover the first channel layer C1' and the second channel layer C2', the first source electrode St and the second source electrode S2', and the first drain electrode D1' and the second drain electrode D2'. A first gate G1' and a second gate G2' may be arranged on the gate insulating layer GI1'. The first gate G1' and the second gate G2' may be disposed above the first channel layer C1' and the second channel layer C2', respectively. Although not illustrated in FIG. 2, a passivation layer may further be arranged above the gate insulating layer GI1' so as to cover the first gate G1' and the second gate G2'. The first transistor T1' may include the first gate G1', the first channel layer C1', the first source electrode S1', and the first drain electrode D1. The second transistor T2' may include the second gate G2', the second channel layer C2', the second source electrode S2', and the second drain electrode D2'. The first transistor T1' may be a depletion mode pull-up transistor and the second transistor T2' may be an enhancement mode pull-down transistor.

The first drain electrode D1' may be connected to a power source terminal VDD, the second gate G2' may be connected to an input terminal Vin, and the first source electrode S1', the second drain electrode D2', and the first gate G1' may be commonly connected to an output terminal Vout. The second source electrode S2' may be grounded.

Figure 3:
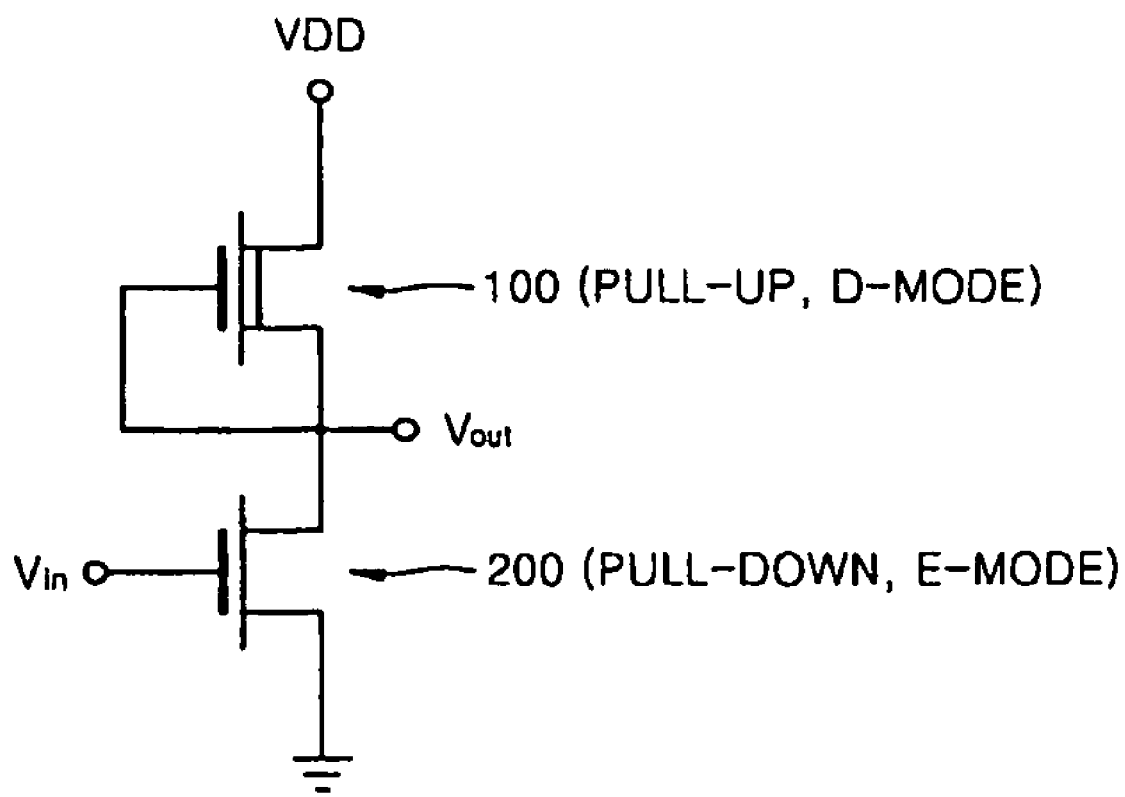
FIG. 3 is a circuit diagram of the inverters of FIGS. 1 and 2.

FIG. 3 is a circuit diagram of the inverters of FIGS. 1 and 2.

Referring to FIG. 3, the depletion mode pull-up transistor 100 and the enhancement mode pull-down transistor 200 are connected to each other. The depletion mode pull-up transistor 100 (hereinafter, referred to as "the pull-up transistor 100") may be the first transistor T1 or T1', and the enhancement mode pull-down transistor 200 (hereinafter, referred to as 'the pull-down transistor 200") may be the second transistors T2 and T2'. A power source terminal VDD may be connected to a drain electrode of the pull-up transistor 100, an input terminal Vin may be connected to a gate of the pull-down transistor 200, and an output terminal Vout may be commonly connected to a source electrode of the pull-up transistor 100 and a drain electrode of the pull-down transistor 200. A gate of the pull-up transistor 100 may also be connected to the output terminal Vout. A source electrode of the pull-down transistor 200 may be grounded.

While a voltage of 0V is applied to the input terminal Vin, that is, while the pull-down transistor 200 is in an OFF-state and a high level power voltage is applied to the drain electrode of the pull-up transistor 100 via the power source terminal VDD, a high level voltage may be detected at the output terminal Vout. When the power voltage is applied to the drain electrode of the pull-up transistor 100 and a voltage greater than a threshold voltage is applied to the input terminal Vin to turn on the pull-down transistor 200, most of the current flows to ground through the pull-down transistor 200. Accordingly, a low level voltage may be detected at the output terminal Vout. That is, while the power source voltage is fixed, the voltage output to the output terminal Vout may be varied according to the voltage applied to the input terminal Vin.

Figure 4:
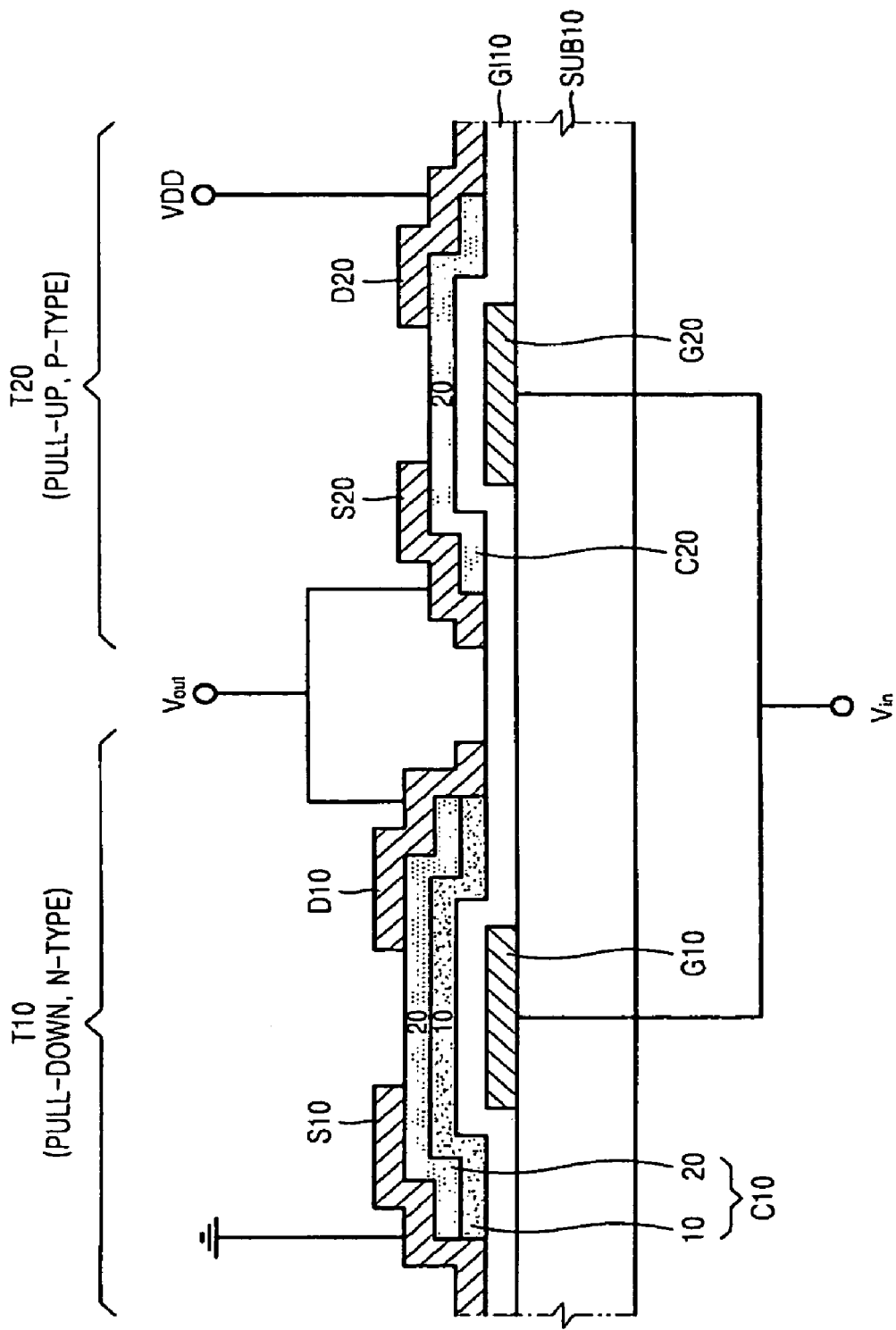
FIGS. 4 and 5 are diagrams of inverters according to another example embodiment.

FIG. 4 is a diagram of an inverter according to another example embodiment.

Referring to FIG. 4, the inverter may include a first transistor T10 and a second transistor T20 that are connected to each other on a substrate SUB10. The first transistor T10 may be an n-channel transistor and the second transistor T20 may be a p-channel transistor. In this case, the first transistor T10 may be a pull-down transistor having a threshold voltage greater than 0V, and the second transistor T20 may be a pull-up transistor having a threshold voltage less than 0V.

In more detail, a first gate G10 and a second gate G20 separated from each other may be arranged above the substrate SUB10, and a gate insulating layer GI10 may be arranged to cover the first gate G10 and the second gate G20. A first channel layer C10 may be arranged on the gate insulating layer GI10 disposed on the first gate G10, and a second channel layer C20 may be arranged on the gate insulating layer GI10 disposed on the second gate G20. The first channel layer C10 and the second channel layer C20 may be oxide layers having different structures. A detailed description about the first channel layer C10 and the second channel layer C20 will be provided later. A first source electrode S10 and a first drain electrode D10 may be arranged to contact ends of the first channel layer C10. A second source electrode S20 and a second drain electrode D20 may be arranged to contact ends of the second channel layer C20. The first drain electrode D10 and the second source electrode S20 may be separated but may be integrally formed. Although not illustrated in FIG. 4, a passivation layer may further be arranged above the gate insulating layer GI10 so as to cover the first channel layer C10, the first source electrode S10, the first drain electrode D10, the second channel layer C20, the second source electrode S20, and the second drain electrode D20. The first transistor T10 may include the first gate G10, the first channel layer C10, the first source electrode S10, and the first drain electrode D10. The second transistor T20 may include the second gate G20, the second channel layer C20, the second source electrode S20, and the second drain electrode D20.

The second drain electrode D20 may be connected to a power source terminal VDD, the first gate G10 and the second gate G20 may be connected to an input terminal Vin, and the first drain electrode D10 and the second source electrode S20 may be connected to an output terminal Vout. The first source electrode S10 may be grounded.

Hereinafter, the first channel layer C10 and the second channel layer C20 will be described in detail. The first channel layer C10 may have a first layer 10 and a second layer 20 that are sequentially stacked. The second channel layer C20 may be the same layer as the second layer 20. If the first layer 10 and the second layer 20 of the first channel layer C10 are called a lower layer and an upper layer, respectively, the second channel layer C20 may be the same layer as the upper layer. The first layer 10 and the second layer 20 may be oxide semiconductor layers. The first layer 10 may be an n-type oxide semiconductor layer and the second layer 20 may be a p-type oxide semiconductor layer. The first layer 10 on the first gate G10 may be used as a main channel. Thus, although the first layer 10 is an n-type and the second layer 20 is a p-type, the first transistor T10 may be the n-channel transistor. Since a second layer 20 of the first channel C10 and the second channel layer C20 is a p-type, the second transistor T20 may be the p-channel transistor. The first layer 10 may be formed of the same material as the second layer 2 of FIG. 1. That is, the first layer 10 may have a relatively low carrier concentration. Thus, the threshold voltage of the first transistor T10 may be greater than 0V. Also, when a thickness of the first layer 10 is small, the first transistor T10 may have a positive (+) threshold voltage. Examples of oxide layers to be used as the first layer 10 and the second layer 20 are shown in Table 2.

TABLE 2

| First layer 10: n-type | Second layer 20: p-type |
| --- | --- |
| GaInZnO(high O2) layer | SnO layer |
| HfInZnO(high O2) layer | SnO2(high O2) layer |

TABLE 2-continued

| First layer 10: n-type | Second layer 20: p-type |
|---|---|
| IZO/GaInZnO(high O2) layer | Metal doped SnO2 layer |
| IZO/HfInZnO(high O2) layer | X-doped ZnO layer (X indicates elements of Groups 1, 2, and 15) |
| ITO/GaInZnO(high O2) layer | |
| ITO/HfInZnO(high O2) layer | NiO layer |
| AZO/GaInZnO(high O2) layer | CuMO2 layer (M is metal of Group 13) |
| AZO/HfInZnO(high O2) layer | |
| GZO/GaInZnO(high O2) layer | Metal doped Cu2O layer |
| GZO/HfInZnO(high O2) layer | SrCu2O2 layer |
| InO/GaInZnO(high O2) layer | LaCuOS(Se) layer |
| InO/HfInZnO(high O2) layer | AgMO2 layer (M is metal of Group 13) |
| Plasma containing nitrogen treated GaInZnO layer | |
| Thin GaInZnO layer (thickness between about 1 and about 30 nm) | |
| Thin HfInZnO layer (thickness between about 1 and about 30 nm) | |

Here, materials to form the first layer 10 are not limited to materials shown in Table 2. Thus, as well as the materials of Table 2, any semiconductor material allowing the threshold voltage of the first transistor T10 to have a positive (+) value may be used to form the first layer 10.

From among materials shown in Table 2 with respect to the second layer 20, a metal of the metal doped SnO2 layer may be aluminum (Al), copper (Cu), or the like, X of the X-doped ZnO layer may be at least one selected from the group consisting of the Group 1 elements such as lithium (Li), Group 2 elements such as magnesium (Mg), and Group 15 elements such as arsenic (As), nitrogen (N), phosphorus (P), or the like, and a metal of the metal doped Cu2O layer may be chromium (Cr), strontium (Sr), or the like. However, a material to form the second layer 20 is not limited to the materials shown in Table 2. That is, other p-type semiconductor materials may be used to form the second layer 20.

In this manner, the types and the threshold voltages with respect to the first transistor T10 and the second transistor T20 may be controlled by allowing the first channel layer C10 and the second channel layer C20 to have different structures and by appropriately selecting materials forming the first channel layer C10 and the second channel layer C20. Thus, it is possible to embody a complementary inverter having the n-type pull-down transistor (the first transistor T10) having the threshold voltage greater than 0V and the p-type pull-up transistor (the second transistor T20) having the threshold voltage less than 0V. Such a complementary inverter may have excellent operational characteristics similar to those of a Si-based complementary metal-oxide semiconductor (CMOS) inverter.

Referring to FIG. 4, the inverter includes the first transistor T10 and the second transistor T20 having a bottom gate structure. Alternatively, the first transistor T10 and the second transistor T20 may individually have a top gate structure. This case is illustrated in FIG. 5.

Figure 5:
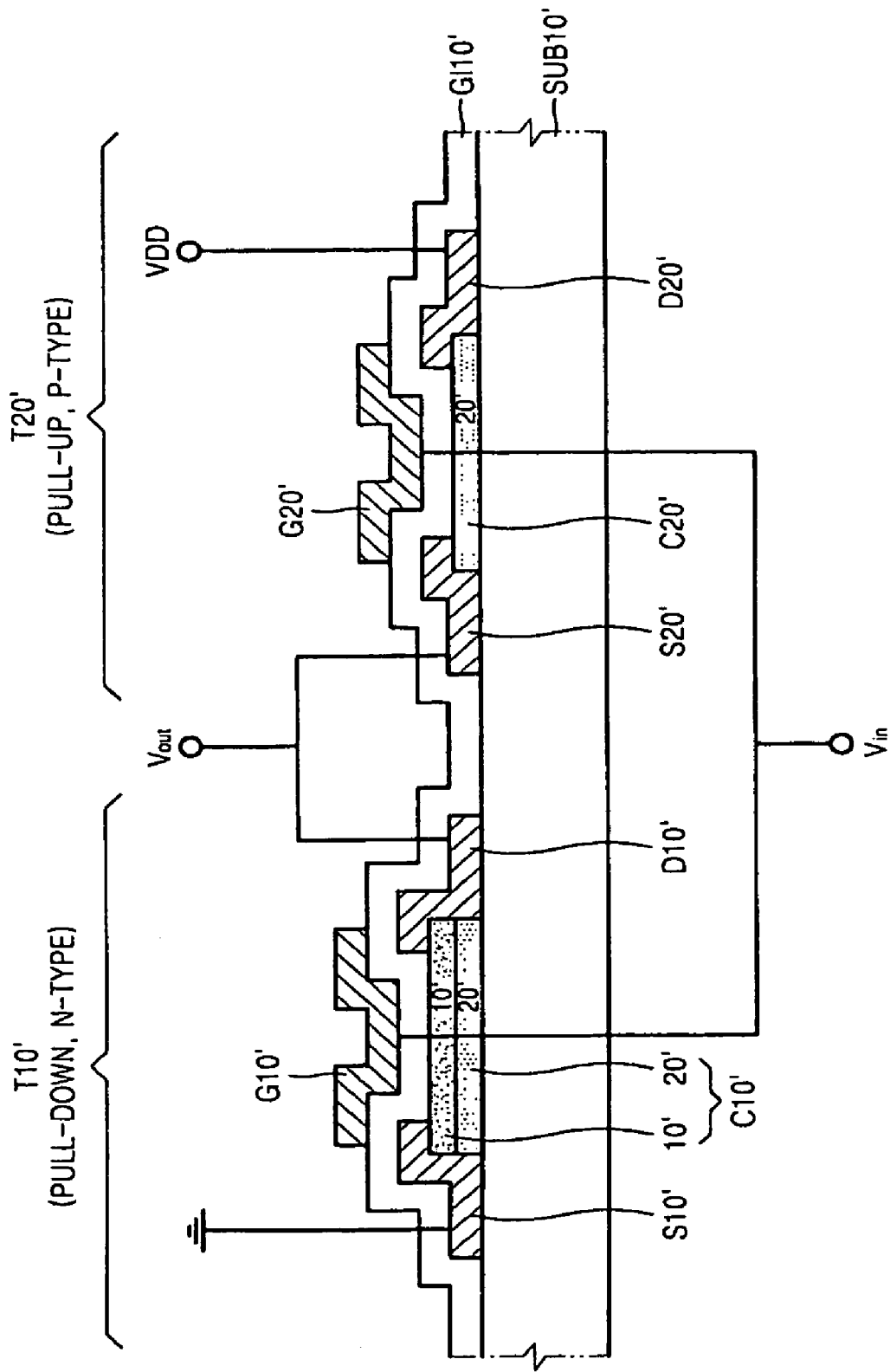

Referring to FIG. 5, a first channel layer C10' and a second channel layer C20', which are separated from each other, may be arranged on a substrate SUB10'. The first channel layer C10' may have a structure in which the positions of the first layer 10 and the second layer 20 are switched. That is, the first channel layer C10' of FIG. 5 may have the structure in which a second layer 20' and a first layer 10' are sequentially stacked on the substrate SUB10'. The first layer 10' may be a single-layer, same as the first layer 10 of FIG. 4. However, the first layer 10' may be a multi-layer such as a double-layer. The second layer 20' may be a single-layer, same as the second layer 20 of FIG. 4. However, the second layer 20' may be a multi-layer, such as a double-layer. In the case where the first layer 10' and the second layer 20' are single-layers, the first layer 10' and the second layer 20' may be the same as the first layer 10 and the second layer 20 of FIG. 4. In the case where the first layer 10' and the second layer 20' are multi-layers, each of the first layer 10' and the second layer 20' may have a structure in which the first layer 10 and the second layer 20 of FIG. 4 are turned upside down. Meanwhile, the second channel layer C20' may be the same layer as the second layer 20'. If the first layer 10' and the second layer 20' of the first channel layer C10' are called an upper layer and a lower layer, respectively, the second channel layer C20' may be the same layer as the lower layer (i.e., the second layer 20').

A first source electrode S10' and a first drain electrode D10' may be arranged on the substrate SUB10' so as to contact ends of the first channel layer C10', respectively. A second source electrode S20' and a second drain electrode D20' may be arranged on the substrate SUB10' so as to contact ends of the second channel layer C20', respectively. A gate insulating layer GI10' may be arranged to cover the first channel layer C10' and the second channel layer C20', the first source electrode S10' and the second source electrode S20', and the first drain electrode D10' and the second drain electrode D20'. A first gate G10' and a second gate G20' may be arranged on the gate insulating layer GI10'. The first gate G10' and the second gate G20' may be disposed above the first channel layer C10' and the second channel layer C20', respectively. Although not illustrated in FIG. 5, a passivation layer may further be arranged above the gate insulating layer GI10' so as to cover the first gate G10' and the second gate G20'. A first transistor T10' may include the first gate G10', the first channel layer C10', the first source electrode S10', and the first drain electrode D10'. A second transistor T20' may include the second gate G20', the second channel layer C20', the second source electrode S20', and the second drain electrode D20'. The first transistor T10' may be an n-type pull-down transistor having a threshold voltage greater than 0V and the second transistor T20' may be a p-type pull-up transistor having a threshold voltage less than 0V.

The second drain electrode D20' may be connected to a power source terminal VDD, the first gate G10' and the second gate G20' may be connected to an input terminal Vin, and the first drain electrode D10' and the second source electrode S20' may be commonly connected to an output terminal Vout. The first source electrode S10' may be grounded.

Figure 6:
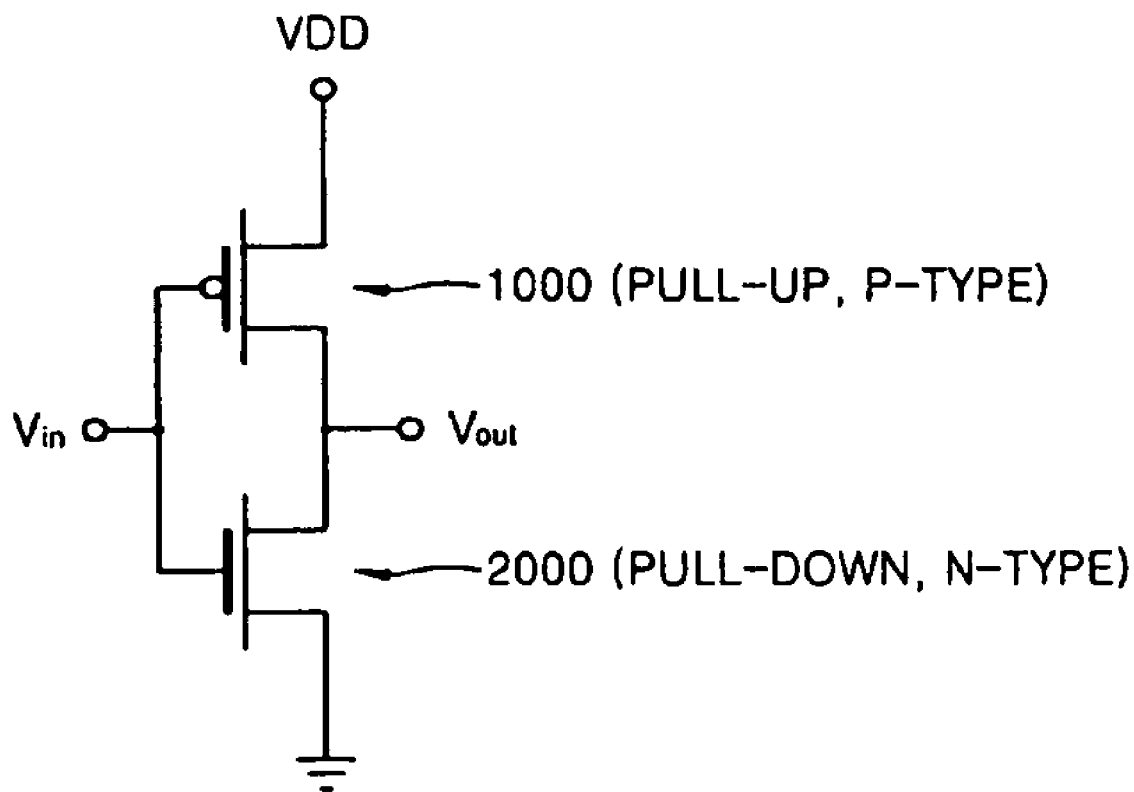
FIG. 6 is a circuit diagram of the inverter of FIGS. 4 and 5.

FIG. 6 is a circuit diagram of the inverter of FIGS. 4 and 5.

Referring to FIG. 6, a p-type pull-up transistor 1000 and an n-type pull-down transistor 2000 are connected to each other. The p-type pull-up transistor 1000 (hereinafter, referred to as "the pull-up transistor 1000") may be the second transistor T20 or T20', and the n-type pull-down transistor 2000 (hereinafter, referred to as "the pull-down transistor 2000") may be the first transistor T10 or T10'. A power source terminal VDD may be connected to a drain electrode of the pull-up transistor 1000, an input terminal Vin may be commonly connected to gates of the pull-up transistor 1000 and the pull-down transistor 2000, and an output terminal Vout may be commonly connected to a source electrode of the pull-up transistor 1000 and a drain electrode of the pull-down transistor 2000. A source electrode of the pull-down transistor 2000 may be grounded.

While a voltage of 0V is applied to the input terminal Vin, that is, while the pull-up transistor 1000 is in an ON-state and the pull-down transistor 2000 is in an OFF-state and a high level power voltage is applied to the drain electrode of the pull-up transistor 1000 via the power source terminal VDD, a high level voltage may be detected at the output terminal Vout. While the power voltage is applied to the drain electrode of the pull-up transistor 1000, and when a voltage is applied to the input terminal Vin to turn off the pull-up transistor 1000 and to turn on the pull-down transistor 2000, a low level voltage may be detected at the output terminal Vout. That is, while the power source voltage is fixed, the voltage output to the output terminal Vout may be varied according to the voltage applied to the input terminal Vin.

FIGS. 7A through 7D illustrate a method of manufacturing an inverter, according to an example embodiment.

Referring to FIG. 7A, a first gate G11 and a second gate G22 may be formed in a first region R1 and a second region R2 of a substrate SUB11, respectively. The substrate SUB11 may be one from among various substrates such as a glass substrate, a silicon substrate, a plastic substrate, and the like, which are used in a semiconductor process. Before forming the first gate G11 and the second gate G22, an under insulating layer (not shown) may be deposited on an upper surface of the substrate SUB11, and the first gate G11 and the second gate G22 may be formed on the under insulating layer. Next, a gate insulating layer GI11 may be formed on the first region R1 and the second region R2 of the substrate SUB11 so as to cover the first gate G11 and the second gate G22. The gate insulating layer GI11 may be formed of a silicon oxide, a silicon nitride, or another insulating material such as a high dielectric material having a dielectric constant greater than that of the silicon nitride.

A first channel material layer 11 may be formed on the gate insulating layer GI11 of the first region R1. The first channel material layer 11 may include a material and a structure, which are the same as those of the first layer 1 of FIG. 1, or the same as those of the first layer 10 of FIG. 4.

Referring to FIG. 7B, a second channel material layer 22 may be formed on the first channel material layer 11 of the first region R1 and the gate insulating layer GI11 of the second region R2. The second channel material layer 22 may include a material and a structure, which are the same as those of the second layer 2 of FIG. 1, or the same as those of the second layer 20 of FIG. 4. Next, the second channel material layer 22 and the first channel material layer 11 may be patterned. The patterning of the second channel material layer 22 and the first channel material layer 11 may be performed using one mask. A result of the patterning is shown in FIG. 7C.

Referring to FIG. 7C, the patterned first channel material layer 11 and second channel material layer 22 may be arranged above the first gate G11, and the patterned second channel material layer 22 may be arranged above the second gate G22. Here, the first channel material layer 11 and the second channel material layer 22 of the first region R1 may correspond to the first layer 1 and the second layer 2 of the first transistor T1 of FIG. 1 or the first layer 10 and the second layer 20 of the first transistor T10 of FIG. 4. The second channel material layer 22 of the second region R2 may correspond to either the second layer 2 of the second transistor T2 of FIG. 1 or the second layer 20 of the second transistor T20 of FIG. 4. The first channel material layer 11 and the second channel material layer 22 of the first region R1 are referred to as a first channel layer C11, and the second channel material layer 22 of the second region R2 is referred to as a second channel layer C22.

Figure 7D:
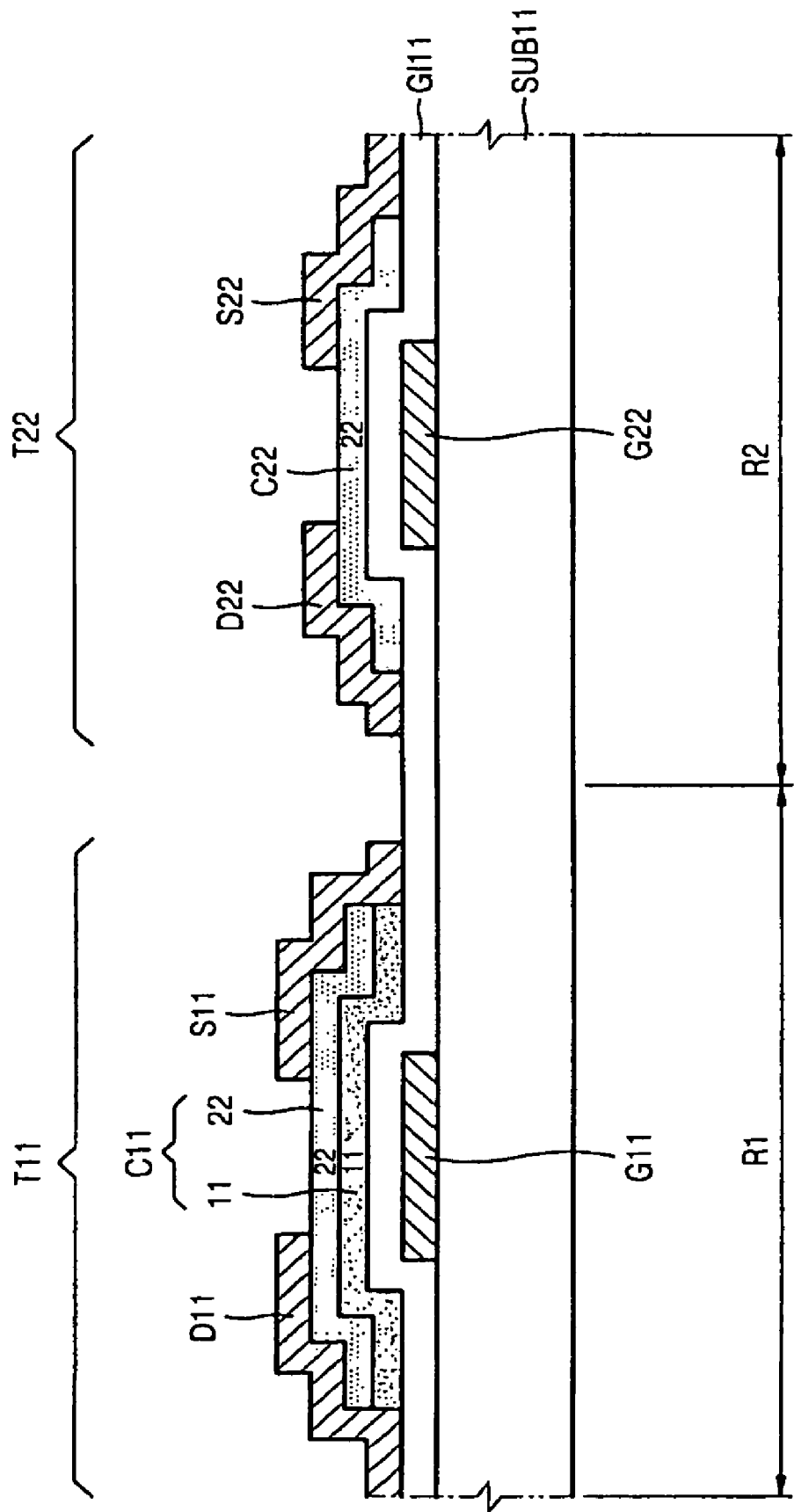

Referring to FIG. 7D, a first source electrode S11 and a first drain electrode D11 may be formed to contact ends of the first channel layer C11. A second source electrode S22 and a second drain electrode D22 may be arranged to contact ends of the second channel layer C22. The first source electrode S11 and the second drain electrode D22 may be separated but may be integrally formed. Although not illustrated in FIG. 7D, a passivation layer may further be formed above the gate insulating layer GI11 so as to cover the first channel layer C11, the first source electrode S11, the first drain electrode D11, the second channel layer C22, the second source electrode S22, and the second drain electrode D22. Before or after forming the passivation layer, annealing may be performed on the resultant product with respect to FIG. 7D at a given temperature. A first transistor T11 may include the first gate G11, the first channel layer C11, the first source electrode S11, and the first drain electrode D11. A second transistor T22 may include the second gate G22, the second channel layer C22, the second source electrode S22, and the second drain electrode D22. The first transistor T11 may correspond to the first transistor T1 or the first transistor T10, and the second transistor T22 may correspond to the second transistor T2 or the second transistor T20.

In the case where a channel layer of the first transistor T11 is a first single layer formed of a first oxide, and a channel layer of the second transistor T22 is a second single layer formed of a second oxide, the first oxide and the second oxide have a low etching selectivity so that an inverter manufacturing method may be complicated. However, as shown in FIG. 7D, the first channel material layer 11 is formed in the first region R1, the second channel material layer 22 is formed in the first and second regions R1 and R2, and then the second channel material layer 22 and the first channel material layer 11 are patterned via one process so that the method of manufacturing the inverter may be simplified.

FIGS. 8A through 8C illustrate a method of manufacturing an inverter, according to another example embodiment.

Referring to FIG. 8A, a second channel material layer 22' may be formed on first and second regions R1' and R2' of a substrate SUB11'. The substrate SUB11' may be the same as the substrate SUB11 of FIG. 7A. The second channel material layer 22' may include a material and a structure, which are the same as those of the second layer 2' of FIG. 2, or the same as those of the second layer 20' of FIG. 5. A first channel material layer 11' may be formed on the second channel material layer 22' of the first region R1'. The first channel material layer 11' may include a material and a structure, which are the same as those of the first layer 1' of FIG. 2, or the same as those of the first layer 10' of FIG. 5. Next, the first channel material layer 11' and the second channel material layer 22' may be patterned. The patterning of the first channel material layer 11' and the second channel material layer 22' may be performed using one mask. A result of the patterning is shown in FIG. 8B.

Referring to FIG. 8B, the patterned first and second channel material layers 11' and 22' may be arranged in the first region R1', and the patterned second channel material layer 22' may be arranged in the second region R2'.

The first channel material layer 11' and the second channel material layer 22' of the first region R1' may correspond to either the first layer 1' and the second layer 2' of the first transistor T1' of FIG. 2 or the first layer 10' and the second layer 20' of the first transistor T10' of FIG. 5. The second channel material layer 22' of the second region R2' may correspond to either the second layer 2' of the second transistor T2' of FIG. 2 or the second layer 20' of the second transistor T20' of FIG. 5. The first channel material layer 11' and the second channel material layer 22' of the first region R1' are referred to as a first channel layer C11', and the second channel material layer 22' of the second region R2' is referred to as a second channel layer C22'.

Referring to FIG. 8C, a first source electrode S11' and a first drain electrode D11' may be formed to contact ends of the first channel layer C11', and a second source electrode S22' and a second drain electrode D22' may be arranged to contact ends of the second channel layer C22'. The first source electrode S11' and the second drain electrode D22' may be separated but may be integrally formed.

A gate insulating layer GI11' may be formed on and above the substrate SUB11' so as to cover the first channel layer C11', the first source electrode S11', the first drain electrode D11', the second channel layer C22', the second source electrode S22', and the second drain electrode D22'. The gate insulating layer GI11' may be formed of a silicon oxide, a silicon nitride, or another insulating material such as a high dielectric material having a dielectric constant greater than that of the silicon nitride.

Next, a first gate G11' may be formed on the gate insulating layer GI11' disposed on the first channel layer C11', and a second gate G22' may be formed on the gate insulating layer GI11' disposed on the second channel layer C22'. Although not illustrated in FIG. 8C, a passivation layer may be further formed above the gate insulating layer GI11' so as to cover the first gate G11' and the second gate G22'. Before or after forming the passivation layer, annealing may be performed on the resultant product with respect to FIG. 8C at a given temperature. A first transistor T11' may include the first gate G11', the first channel layer C11', the first source electrode S11', and the first drain electrode D11'. A second transistor T22' may include the second gate G22', the second channel layer C22', the second source electrode S22', and the second drain electrode D22'. The first transistor T11' may correspond to the first transistor T1' of FIG. 2 or the first transistor T10' of FIG. 5, and the second transistor T22' may correspond to the second transistor T2' of FIG. 2 or the second transistor T20' of FIG. 5.

Figure 9:
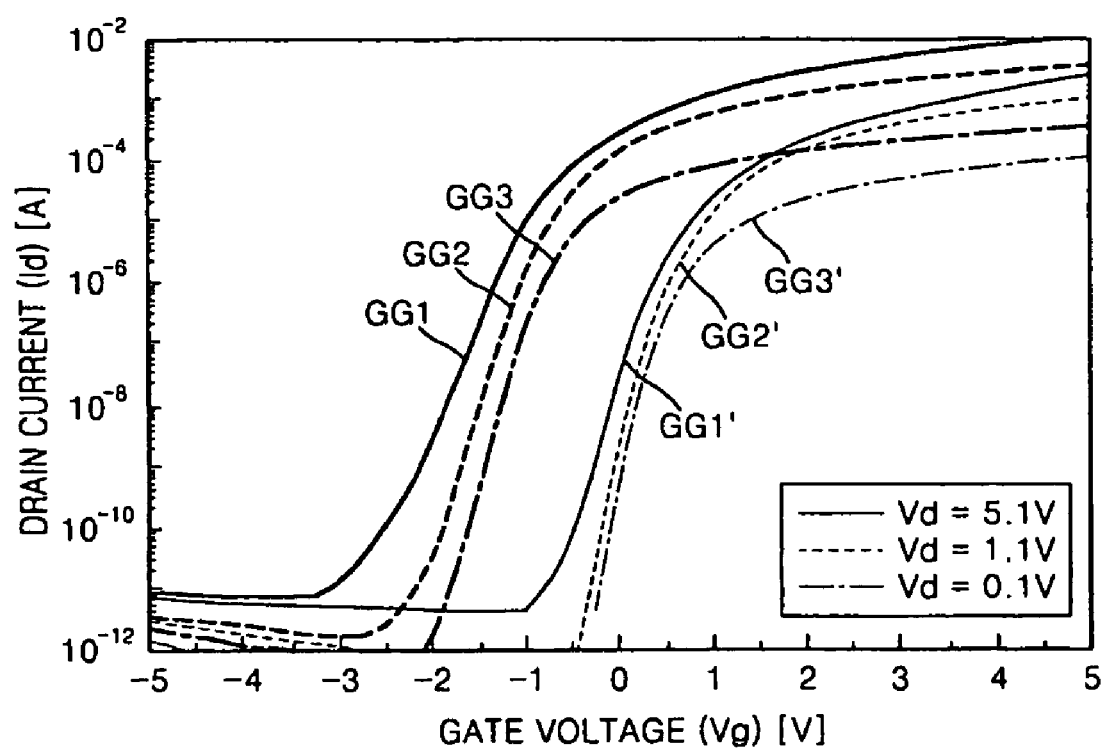
FIG. 9 is a graph of gate voltage (Vg)-drain current (Id) characteristics of a pull-up transistor and a pull-down transistor that are included in the inverter according to an example embodiment.

FIG. 9 is a graph of gate voltage (Vg)-drain current (Id) characteristics of a pull-up transistor and a pull-down transistor that are included in the inverter according to example embodiments. Referring to FIG. 9, first through third graphs GG1-GG3 show results with respect to the pull-up transistor having the structure of the first transistor T1 of FIG. 1, and fourth through sixth graphs GG1'-GG3' show results with respect to the pull-down transistor having the structure of the second transistor T2 of FIG. 1. An IZO layer was used as the first layer 1, and a GaInZnO layer was used as the second layer 2. A drain voltage of 5.1V was used to obtain the results of the first and fourth graphs GG1 and GG1', a drain voltage of 1.1V was used to obtain the results of the second and fifth graphs GG2 and GG2', and a drain voltage of 0.1V was used to obtain the results of the third and sixth graphs GG3 and GG3'.

Referring to FIG. 9, the first through third graphs GG1-GG3 are positioned more to the left side than the fourth through sixth graphs GG1'-GG3'. At this time, a threshold voltage of the first through third graphs GG1-GG3 was between about −1.5V and about −1.0V, and a threshold voltage of the fourth through sixth graphs GG1'-GG3' was between about 0.7V and about 0.8V. This indicates that the pull-up transistor is a depletion mode transistor having a threshold voltage less than 0V, and the pull-down transistor is an enhancement mode transistor having a threshold voltage greater than 0V.

The first through third graphs GG1-GG3 show that the ON current is higher than that of the fourth through sixth graphs GG1'-GG3'.

Figure 10:
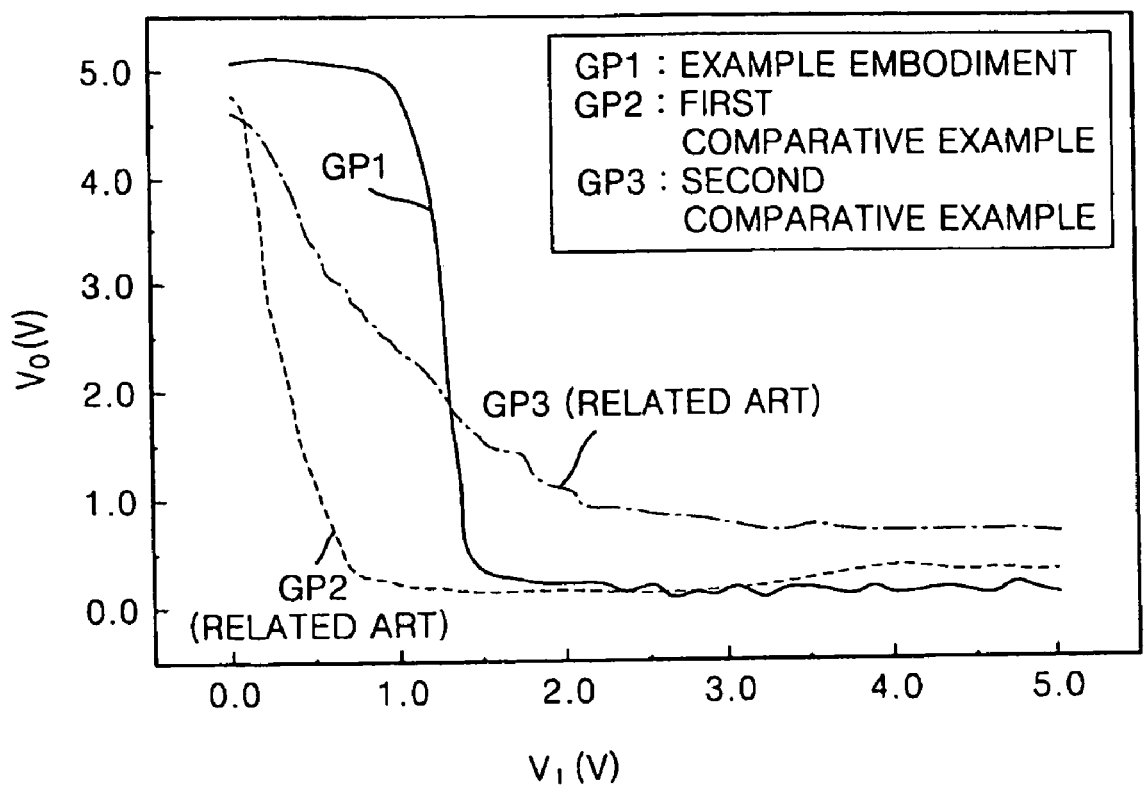
FIG. 10 is a graph of input voltage ($V_I$)-output voltage ($V_O$) characteristics with respect to the inverter according to an example embodiment and inverters according to first and second comparative examples.

FIG. 10 is a graph of input voltage ($V_I$)-output voltage ($V_O$) characteristics with respect to the inverter according to example embodiments and inverters according to first and second comparative examples. In FIG. 10, a first graph GP1 shows a result with respect to the inverter according to example embodiments, wherein the inverter has the structure shown in FIG. 1 and includes an IZO layer as the first layer 1 and a GaInZnO layer as the second layer 2. In FIG. 10, a second graph GP2 shows a result with respect to the inverter according to the first comparative example having an enhancement mode pull-up transistor and an enhancement mode pull-down transistor, which are connected to each other, and an enhancement mode pre-charge transistor connected to a gate of the enhancement mode pull-up transistor. A source electrode of the enhancement mode pre-charge transistor is connected to the gate of the enhancement mode pull-up transistor, and a gate and drain electrode of the enhancement mode pull-up transistor and a drain electrode of the pull-up transistor are commonly connected to a power source terminal. At this time, channel layers of the pull-up transistor, the pull-down transistor, and the enhancement mode pre-charge transistor have a GaInZnO single-layer structure. In FIG. 10, a third graph GP3 shows a result with respect to the inverter according to the second comparative example having a depletion mode pull-up transistor including a first GaInZnO single-layer as a channel layer and an enhancement mode pull-down transistor including a second GaInZnO single-layer as a channel layer. Meanwhile, a power source voltage Vdd of 5V was used to obtain the results shown in FIG. 10. Here, an input voltage $V_I$ and the power source voltage Vdd are respectively applied to an input terminal Vin and a power source terminal VDD, and an output voltage $V_O$ is detected at an output terminal Vout.

The results of FIG. 10 are shown in Table 3.

TABLE 3

| Division | Example embodiment (GP1) | First comparative example (GP2) | Second comparative example (GP2) |
|---|---|---|---|
| $V_{OH}$ (High logical level output) | 5 V | 4.85 V | 4.8 V |
| $V_{OL}$ (Low logical level output) | 0.15 V | 0.35 V | 0.7 V |
| Output voltage swing | 4.85 V | 4.5 V | 4.1 V |
| Switching voltage gain (∂Vo/∂Vi) | 15 | 8 | 4 |

Referring to Table 3, a high level output voltage $V_{OH}$ of the inverter is higher than each of high level output voltages of the inverters according to the first and second comparative examples, and a low level output voltage $V_{OL}$ of the inverter is lower than each of low level output voltages of the inverters according to the first and second comparative examples. Thus, an output voltage swing of the inverter is greater than an output voltage swing of the inverter according to the first and second comparative examples. Also, a switching voltage gain of the inverter is higher than a switching voltage gain of the inverter according to the first and second comparative examples. This indicates that operational characteristics of the inverter are excellent compared to the operational characteristics of the inverters according to the first and second comparative examples.

The inverter may be used as a basic device of various logic circuits such as a NAND (not and) gate, a NOR (not or) gate, an encoder, a decoder, a multiplexer (MUX), a demultiplexer (DEMUX), a sense amplifier, an oscillator, or the like. Basic structures of the various logic circuits are well known.

Figure 14:
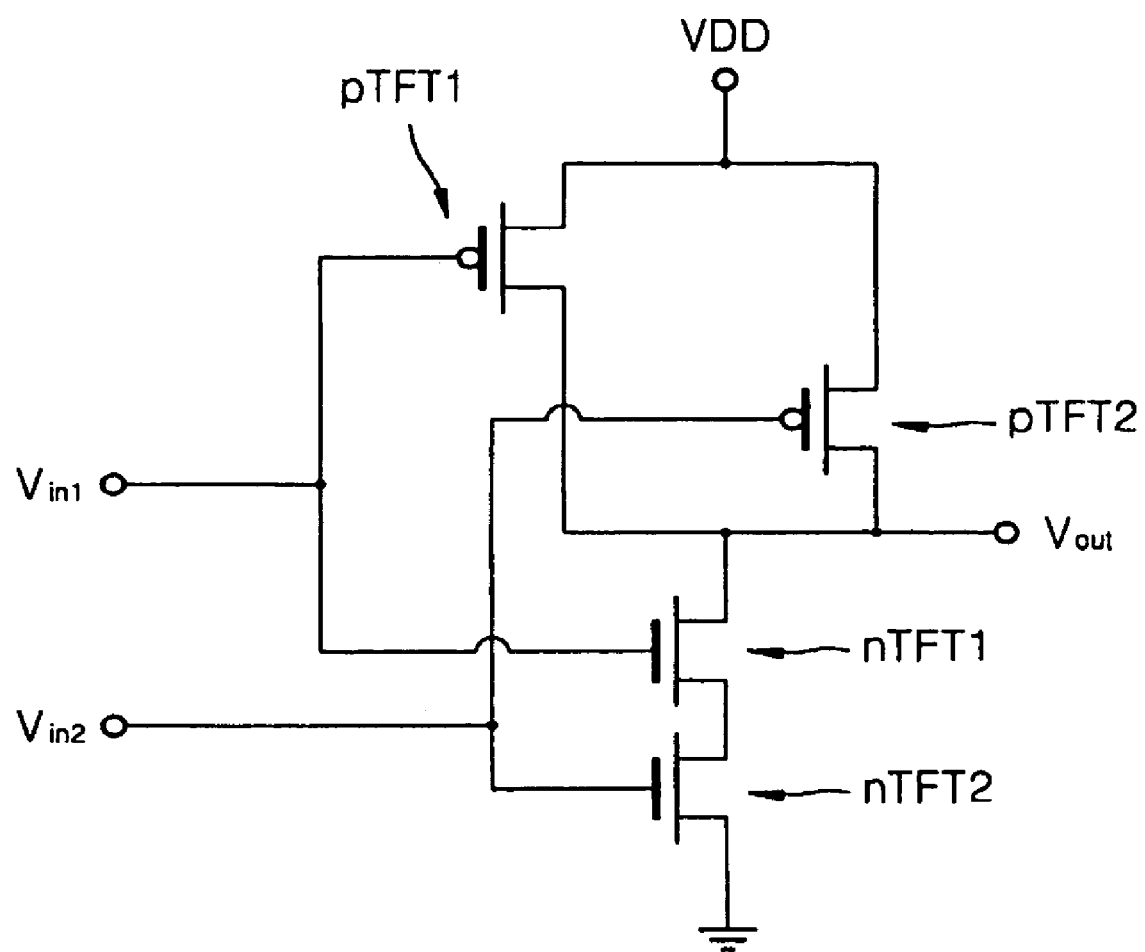
FIG. 14 is a circuit diagram of a logic circuit including an inverter according to an example embodiment.

FIG. 14 is a circuit diagram of a NAND gate according to an example embodiment.

Referring to FIG. 14, two p-type transistors pTFT1 and pTFT2 may be connected in parallel, and two n-type transistors nTFT1 and nTFT2 may be connected to the common drain of the two p-type transistors pTFT1 and pTFT2 in series. Sources of the two p-type transistors pTFT1 and pTFT2 may be connected to a power source terminal VDD, and the common drain of the two p-type transistors pTFT1 and pTFT2 may be connected to an output terminal Vout. A gate of the p-type transistor pTFT1 and a gate of the n-type transistor nTFT1 may be connected to a first input terminal Vin1, and a gate of the p-type transistor pTFT2 and a gate of the n-type transistor nTFT2 may be connected to a second input terminal Vin2. A source of the n-type transistor nTFT2 may be grounded.

The inverter and the logic circuit including the inverter may be applied to various semiconductor devices including a memory device, a liquid crystal display device, an organic light emitting display device, or the like. In the case where the pull-up transistor and the pull-down transistor of the inverter are an oxide thin film transistor, the oxide thin film transistor may be formed using a low temperature process and has excellent mobility. For example, the inverter formed of the oxide thin film transistor may be used as a peripheral device of a 3-dimensional (3D) stack memory such as a 1D(diode)-1R(resistor) multi-layer cross point memory device which may be formed using a low temperature process. In addition, the inverter and the logic circuit including the inverter may be fabricated on a glass substrate so that the inverter and the logic circuit including the inverter may be easily applied in a system on glass (SOG) field.

Figure 11:
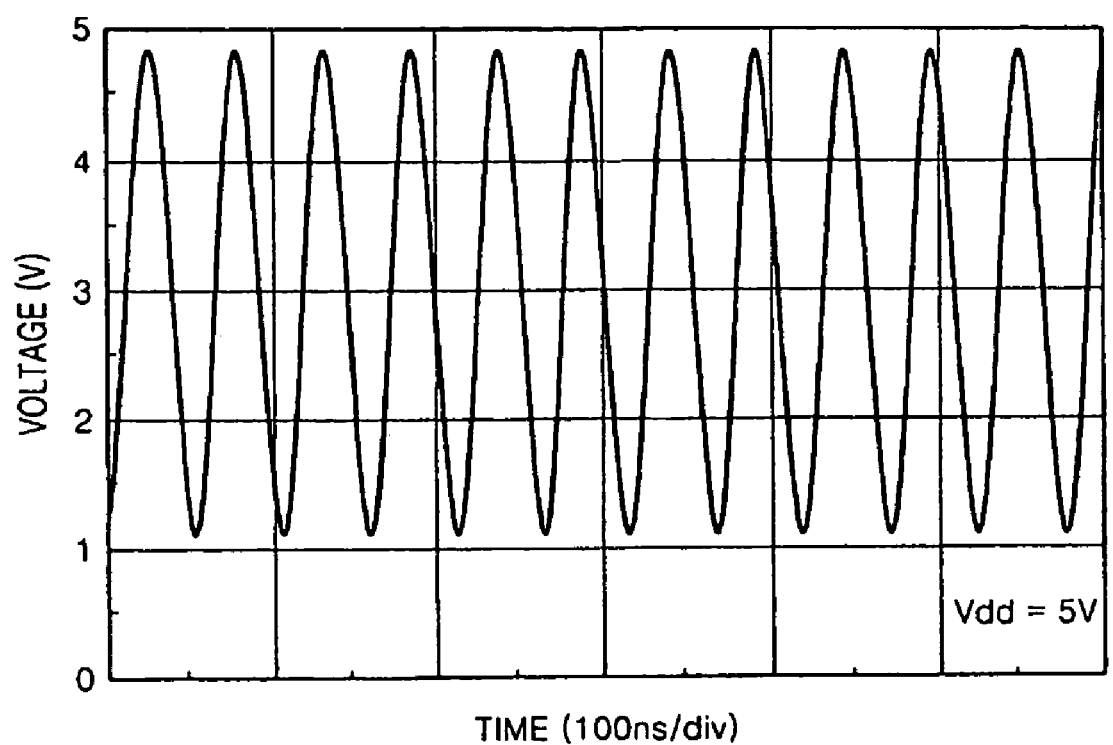
FIG. 11 is a graph of a voltage vibration characteristic of a ring oscillator including a plurality of inverters according to an example embodiment.

FIG. 11 is a graph of a voltage vibration characteristic of a ring oscillator including a plurality of inverters according to example embodiments. The ring oscillator includes the inverters that are individually the same as the inverter with respect to the first graph GP1 of FIG. 10.

Figure 12:
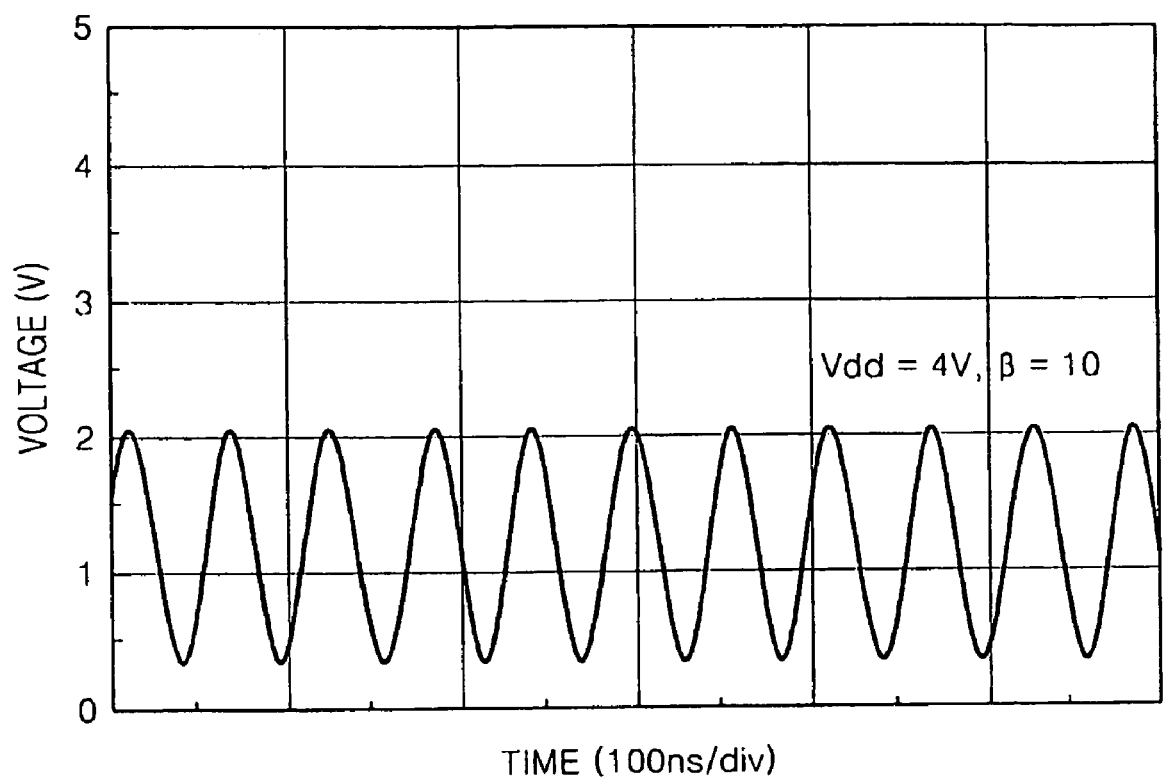
FIGS. 12 and 13 are graphs of voltage vibration characteristics of ring oscillators including a plurality of inverters according to first and second comparative examples.

FIG. 12 is a graph of a voltage vibration characteristic of a ring oscillator including a plurality of inverters according to a first comparative example. Each of the inverters according to the first comparative example is the same as the inverter according to the first comparative example of FIG. 10.

Figure 13:
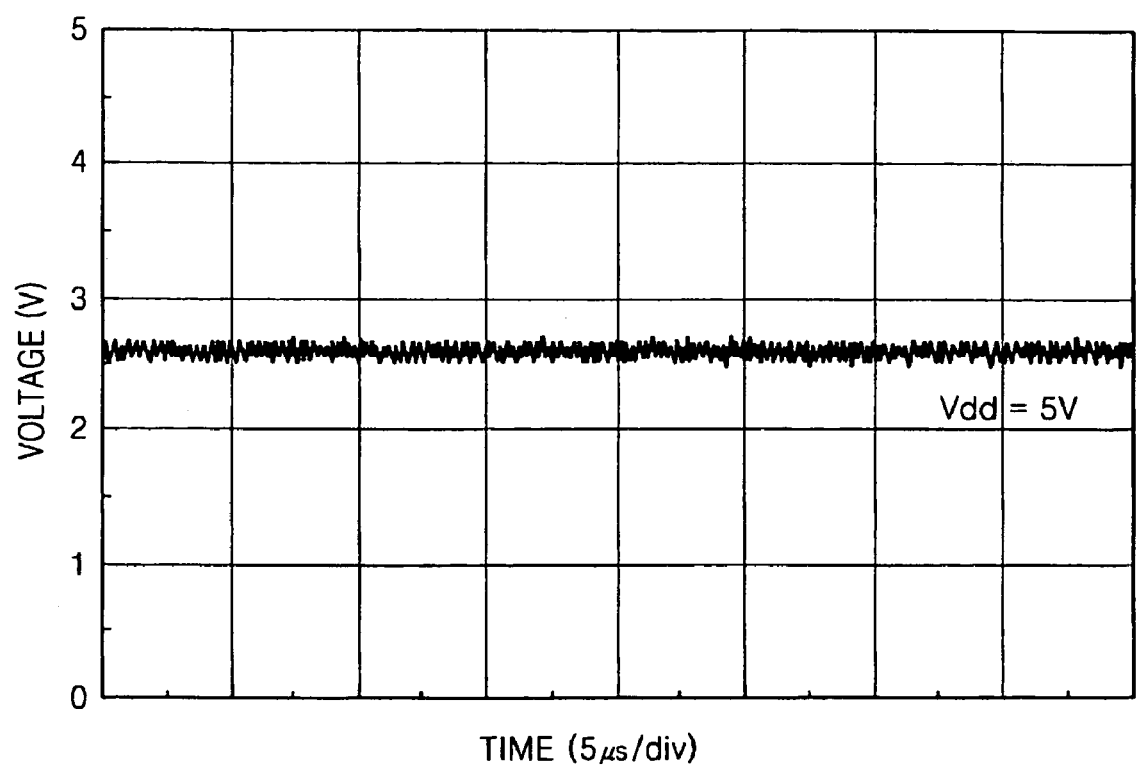

FIG. 13 is a graph of a voltage vibration characteristic of a ring oscillator including a plurality of inverters according to a second comparative example. Each of the inverters according to the second comparative example is the same as the inverter according to the second comparative example of FIG. 10.

The ring oscillators used to obtain the results shown in FIGS. 11 through 13 are 7-stage oscillators.

Comparing the results shown in FIGS. 11 and 12, the amplitude of vibration of the graph of FIG. 11 is about twice as large as that of the graph of FIG. 12. This indicates that the ring oscillator including the inverters according to example embodiments has an excellent characteristic compared to that of the ring oscillator including the inverters according to the first comparative example. Meanwhile, referring to the graph of FIG. 13, the ring oscillator including the inverters according to the second comparative example does not exhibit the voltage vibration characteristic.

In addition, a propagation delay of the ring oscillator including the inverters according to example embodiments was about 4 ns/stage. This indicates that the inverter according to example embodiments has a high operational speed. Also, average power consumption of the ring oscillator including the inverters according to example embodiments was about 20 mW that is significantly less than 90 mW of the ring oscillator including the inverters according to the first comparative example.

It should be understood that example embodiments should be considered in a descriptive sense only and not for purposes of limitation. For example, it will be understood by one of ordinary skill in the art that the pull-up transistor and the pull-down transistor included in the inverter according to example embodiments may be a stagger type transistor or a planar type transistor. Also, it will be understood by one of ordinary skill in the art that at least one selected from the group consisting of the first layers 1 and 1' and the second layers 2 and 2' of FIGS. 1 and 2 may not be formed of oxide but may be formed of a semiconductor material selected from the group consisting of amorphous silicon, polycrystalline silicon, an organic semiconductor and combinations thereof. In a similar manner, at least one selected from the group consisting of the first layers 10 and 10' and the second layers 20 and 20' of FIGS. 4 and 5 may not be formed of oxide but may be formed of a semiconductor material selected from the group consisting of amorphous silicon, polycrystalline silicon, an organic semiconductor and combinations thereof. In addition, it will be understood by one of ordinary skill in the art that the units and structures of the inverter with respect to FIGS. 1 through 6 may vary and the method of manufacturing the inverter described with reference to FIGS. 7A through 8C may be modified in various ways. Therefore, the scope of example embodiments are not defined by the detailed description but by the appended claims.

What is claimed is:

1. A method of manufacturing an inverter, the method comprising:
    forming a first gate and a second gate on a first region and a second region, respectively, of a substrate;
    forming a gate insulating layer to cover the first gate and the second gate;
    forming a first channel material layer directly on the gate insulating layer of the first region;
    forming a second channel material layer directly on the first channel material layer of the first region and the gate insulating layer of the second region;
    forming a first channel layer including the first channel material layer and the second channel material layer stacked on the first region, and a second channel layer including the second channel material layer on the second region, by patterning the second channel material layer and the first channel material layer; and
    forming a first source electrode and a first drain electrode contacting ends of the first channel layer, and forming a second source electrode and a second drain electrode contacting ends of the second channel layer.

2. The method of claim 1, wherein the first channel material layer and the second channel material layer comprise a single-layer structure or a double-layer structure.

3. The method of claim 1, wherein at least one of the first channel material layer and the second channel material layer comprises an oxide layer.

4. The method of claim 1, wherein the first channel material layer and the second channel material layer are an n-type layer.

5. The method of claim 4, wherein the first channel material layer has a carrier concentration higher than a carrier concentration of the second channel material layer.

6. The method of claim 5, wherein a first transistor includes the first gate, the gate insulating layer, the first channel layer, the first source electrode, and the first drain electrode is a depletion mode pull-up transistor, and
    a second transistor includes the second gate, the gate insulating layer, the second channel layer, the second source electrode, and the second drain electrode is an enhancement mode pull-down transistor.

7. The method of claim 1, wherein the first channel material layer is an n-type layer, and the second channel material layer is a p-type layer.

8. The method of claim 7, wherein a first transistor includes the first gate, the gate insulating layer, the first channel layer, the first source electrode, and the first drain electrode is a pull-down transistor having a threshold voltage greater than 0V, and a second transistor includes the second gate, the gate insulating layer, the second channel layer, the second source electrode, and the second drain electrode is a pull-up transistor having a threshold voltage less than 0V.

9. A method of manufacturing an inverter, the method comprising:

forming a first channel material layer on a first region and a second region of a substrate;

forming a second channel material layer on the first channel material layer of the first region;

forming a first channel layer including the first channel material layer and the second channel material layer stacked on the first region, and a second channel layer including the first channel material layer on the second region, by patterning the second channel material layer and the first channel material layer;

forming a first source electrode and a first drain electrode contacting ends of the first channel layer, and forming a second source electrode and a second drain electrode contacting ends of the second channel layer;

forming a gate insulating layer to cover the first channel layer, the second channel layer, the first source electrode, the second source electrode, the first drain electrode, and the second drain electrode, the forming a gate insulating layer including forming the gate insulating layer directly on a portion of the second channel material layer of the first channel layer and directly on a portion of the first channel material layer of the second channel layer; and forming a first gate on the gate insulating layer of the first region, and forming a second gate on the gate insulating layer of the second region.

10. The method of claim 9, wherein the first channel material layer and the second channel material layer comprise a single-layer structure or a double-layer structure.

11. The method of claim 9, wherein at least one of the first channel material layer and the second channel material layer comprises an oxide layer.

12. The method of claim 9, wherein the first channel material layer and the second channel material layer are an n-type layer.

13. The method of claim 12, wherein the second channel material layer has a carrier concentration higher than a carrier concentration of the first channel material layer.

14. The method of claim 13, wherein a first transistor includes the first gate, the gate insulating layer, the first channel layer, the first source electrode, and the first drain electrode, is a depletion mode pull-up transistor, and a second transistor includes the second gate, the gate insulating layer, the second channel layer, the second source electrode, and the second drain electrode, is an enhancement mode pull-down transistor.

15. The method of claim 9, wherein the first channel material layer is a p-type layer, and the second channel material layer is an n-type layer.

16. The method of claim 15, wherein a first transistor includes the first gate, the gate insulating layer, the first channel layer, the first source electrode, and the first drain electrode is a pull-down transistor having a threshold voltage greater than 0V, and a second transistor includes the second gate, the gate insulating layer, the second channel layer, the second source electrode, and the second drain electrode is a pull-up transistor having a threshold voltage less than 0V.

17. The method of claim 1, wherein the second channel layer is the patterned second channel material layer.

18. The method of claim 9, wherein the second channel layer is the patterned first channel material layer.

* * * * *